US009768777B2

(12) United States Patent
Yao et al.

(10) Patent No.: US 9,768,777 B2
(45) Date of Patent: *Sep. 19, 2017

(54) SYSTEMS AND METHODS OF LEVEL SHIFTING FOR VOLTAGE DRIVERS

(71) Applicant: ON-BRIGHT ELECTRONICS (SHANGHAI) CO., LTD., Shanghai (CN)

(72) Inventors: Chao Yao, Shanghai (CN); Tingzhi Yuan, Shanghai (CN); Qiang Luo, Shanghai (CN); Zhiliang Chen, Shanghai (CN); Lieyi Fang, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 111 days.

This patent is subject to a terminal disclaimer.

(21) Appl. No.: 14/243,827

(22) Filed: Apr. 2, 2014

(65) Prior Publication Data
US 2014/0210541 A1    Jul. 31, 2014

Related U.S. Application Data

(63) Continuation of application No. 13/415,329, filed on Mar. 8, 2012, now Pat. No. 8,736,345.

(30) Foreign Application Priority Data

Feb. 7, 2012 (CN) .......................... 2012 1 0031977

(51) Int. Cl.
*H03L 5/00* (2006.01)
*H03K 19/0175* (2006.01)

(52) U.S. Cl.
CPC . *H03K 19/0175* (2013.01); *H03K 19/017527* (2013.01); *H03K 2217/0063* (2013.01); *H03K 2217/0081* (2013.01)

(58) Field of Classification Search
CPC ....... H03K 19/0175; H03K 19/018528; H03K 3/012; H03K 3/013
(Continued)

(56) References Cited

U.S. PATENT DOCUMENTS 6,501,321 B2    12/2002    Kumagai
7,629,851 B2 *  12/2009    Tsurumaki .............. H03F 1/301
                                                            330/134
(Continued)

FOREIGN PATENT DOCUMENTS

CN    101110570 A    1/2008

OTHER PUBLICATIONS

Chinese Patent Office, Office Action issued Feb. 27, 2015, in Application No. 201210031977.0.

*Primary Examiner* — Dinh T Le
(74) *Attorney, Agent, or Firm* — Jones Day

(57) ABSTRACT

System and method for controlling one or more switches. The system includes a first converting circuit, a second converting circuit, and a signal processing component. The first converting circuit is configured to convert a first current and generate a first converted voltage signal based on at least information associated with the first current. The second converting circuit is configured to convert a second current and generate a second converted voltage signal based on at least information associated with the second current. The signal processing component is configured to receive the first converted voltage signal and the second converted voltage signal and generate an output signal based on at least information associated with the first converted voltage signal and the second converted voltage signal.

20 Claims, 10 Drawing Sheets

(58) Field of Classification Search
USPC .................. 327/306, 333; 326/61–62, 80–81
See application file for complete search history.

(56) References Cited

U.S. PATENT DOCUMENTS

| | | | |
|---|---|---|---|
| 7,859,906 B1 | 12/2010 | Vispute | |
| 7,911,255 B2* | 3/2011 | Ochi ..................... | H03F 3/2173 |
| | | | 323/312 |
| 8,405,422 B2* | 3/2013 | Akahane ........ | H03K 19/018521 |
| | | | 326/62 |
| 8,736,345 B2* | 5/2014 | Yao ................ | H03K 19/017527 |
| | | | 326/62 |
| 2008/0315938 A1* | 12/2008 | Ishikawa .............. | H03K 17/567 |
| | | | 327/333 |

* cited by examiner

SYSTEMS AND METHODS OF LEVEL SHIFTING FOR VOLTAGE DRIVERS

1. CROSS-REFERENCES TO RELATED APPLICATIONS

This application is a continuation of U.S. patent application Ser. No. 13/415,329, filed Mar. 8, 2012, which claims priority to Chinese Patent Application No. 201210031977.0, filed Feb. 7, 2012, both applications being commonly assigned and incorporated by reference herein for all purposes.

2. BACKGROUND OF THE INVENTION

The present invention is directed to integrated circuits. More particularly, the invention provides level shifting for voltage drivers. Merely by way of example, the invention has been applied to half-bridge or full-bridge topologies (e.g., LLC resonant topologies). But it would be recognized that the invention has a much broader range of applicability.

Switch-mode power supplies have been developed and used for low-power applications as well as high-power applications. Power-supply chips that often are highly integrated usually need to accommodate both high-voltage usage and low-voltage usage, which may involve many issues, such as voltage tolerance, noise, speed, and parasitics. Challenges remain to develop proper interface circuits for both high-voltage signals and low-voltage signals. For example, for normal circuit operations, voltages applied on devices usually need to be kept within a certain range. As another example, signals often need to be transmitted quickly while signal accuracy needs to be maintained. In yet another example, power consumption and heat generation of a switch-mode power supply usually needs to be reduced, and efficiency of the power supply needs to be improved. In yet another example, satisfactory performance of electrostatic-discharge (ESD) is often needed.

To improve integration of the power-supply chips and reduce costs and power consumption, control circuits of the power-supply chips usually are kept at a low voltage (e.g., 5-6 V). Output circuits of the power-supply chips (e.g., gate drivers), such as certain half-bridge high-side level-shift and gate driver components, often generate a high output voltage (e.g., several hundred volts).

FIG. 1 is a simplified conventional diagram showing a system with level shifting for controlling switches. The system 100 includes a signal generator 102, a high-side level-shift and gate driver component 104, a low-side gate driver 106, two switches 108 and 110, a capacitor 112, a diode 114 and an inductor 116.

For example, the switch 108 is a metal-oxide-semiconductor field effect transistor (MOSFET) or an insulated gate bipolar transistor (IGBT). In another example, the switch 110 is a metal-oxide-semiconductor field effect transistor (MOSFET) or an insulated gate bipolar transistor (IGBT). In yet another example, the signal generator 102 generates pulse-width-modulation (PWM) signals.

The low-side gate driver 106 receives a low-side voltage 126 (e.g., vddl) and a reference voltage 128 (e.g., GND). A voltage signal 137 (e.g., VREG) is received at the diode 114 which generates a voltage 130 (e.g., vddh). The high-side level-shift and gate driver component 104 receives the high-side voltage 130 (e.g., vddh) and a high-side floating voltage 132. The switches 108 and 110 receive an input voltage 136 (e.g., $V_{in}$) and the reference voltage 128. For example, the high-side floating voltage 132 is associated with a half-bridge node 134 (e.g., HB). In yet another example, the reference voltage 128 (e.g., GND) is a ground voltage (e.g., 0V). In yet another example, the magnitude of the voltage signal 137 (e.g., VREG) is in the range of 10 V to 20 V. In yet another example, the input voltage 136 (e.g., $V_{in}$) is up to 400 V. In yet another example, the high-side floating voltage 132 changes (e.g., between 0 V and the input voltage 136) based on the status of the switches 108 and 110 and the system 100. In yet another example, the high-side voltage 130 (e.g., vddh) is higher than the high-side floating voltage 132, and the difference between the high-side voltage 130 (e.g., vddh) and the high-side floating voltage 132 is approximately equal to the voltage signal 137 (e.g., VREG) minus a forward voltage of the diode 114 in magnitude.

In operation, the signal generator 102 generates a high-side modulation signal 118 (e.g., PWM_H) and a low-side modulation signal 120 (e.g., PWM_L). The high-side level-shift and gate driver component 104 receives the high-side modulation signal 118 and in response generates a high-side gate-drive signal 122 (e.g., GATE_HV) to drive the switch 108. The low-side gate driver 106 receives the low-side modulation signal 120 and in response generates a low-side gate-drive signal 124 (e.g., GATEL) to drive the switch 110.

FIG. 2 is a simplified conventional diagram showing certain components of the high-side level-shift and gate driver component 104 as part of the system 100. The high-side level-shift and gate driver component 104 includes a pulse generator 202, a level-shift circuit 204, and a high-side gate driver 298. The level-shift circuit 204 includes two transistors 206 and 208, four resistors 210, 212, 214 and 216, two Zener diodes 218 and 220, two inverters 222 and 224, and a flip-flop 226. For example, the transistor 206 includes a parasitic capacitor 228, and the transistor 208 includes a parasitic capacitor 230. In another example, the transistors 206 and 208 are both N-channel MOSFETs.

The transistors 206 and 208 can sustain high drain-source voltages. The resistors 214 and 216 are used to limit the maximum currents that flow through the transistors 206 and 208, respectively. The resistors 210 and 212 are used to set the initial status of the level-shift circuit 204. The Zener diodes 218 and 220 are used to set minimum values of signals 240 (e.g., setb) and 246 (e.g., resetb) to a floating voltage 242 (e.g., HB), respectively.

In operation, the pulse generator 202 receives a modulation signal 232 (e.g., PWM_H as shown by a waveform 256). For example, the pulse generator 202, in response, generates a pulse signal 234 (e.g., set) at a rising edge of the modulation signal 232 (e.g., as shown by a waveform 258). The pulse generator 202 also generates a pulse signal 236 (e.g., reset) at a falling edge of the modulation signal 232 (e.g., as shown by a waveform 260).

If the transistor 206 is turned on by the pulse signal 234 (e.g., set), a current 238 flows through the transistor 206 (e.g., HVNM1) and the resistor 214 (e.g., $R_{dn}$). For example, a maximum value of the current 238 is determined based on the level of the pulse signal 234 and the resistance of the resistor 214. If a voltage generated at the resistor 210 (e.g., $R_{up}$) is larger than a breakdown voltage of the Zener diode 218, a large portion of the current 238 flows through the Zener diode 218. If the resistance of the resistor 210 is large enough, a small portion of the current 238 flows through the resistor 210. Once the Zener diode 218 breaks down, the signal 240 (e.g., setb) is close to the floating voltage 242. The inverter 222, in response, generates a signal 248 (e.g., at a logic high level) when the signal 240 falls below a threshold level of the inverter 222. When the transistor 206 is turned on by the pulse signal 234 (e.g., set), the transistor 208 (e.g., HVNM2) is off as the pulse signal 236 (e.g., reset) is at a logic low level. The signal 246 (e.g., resetb) is close to a voltage 244 (e.g., vddh). The inverter 224 generates a signal 250 (e.g., at the logic low level). The flip-flop 226 receives the signals 248 and 250, and generates a pre-gate-drive signal 252 (e.g., at the logic high level). The high-side gate driver 298 receives the pre-gate-drive signal 252 and outputs a gate drive signal 299 (e.g., GATE_HV). For example, the signal 240 (e.g., setb) and the signal 246 (e.g., resetb) each vary from the input voltage 136 (e.g., $V_{in}$) to the sum of the input voltage 136 and the voltage signal 137 (e.g., VREG) of FIG. 1. As another example, the signal 240 (e.g., setb) and the signal 246 (e.g., resetb) vary from 400 V to 411V.

If the transistor 208 is turned on by the pulse signal 236 (e.g., reset), a current 254 flows through the transistor 208 and the resistor 216 (e.g., $R_{dn}$). For example, a maximum value of the current 254 is determined based on the level of the pulse signal 236 and the resistance of the resistor 216. If a voltage generated at the resistor 212 (e.g., $R_{up}$) is larger than a breakdown voltage of the Zener diode 220, a large portion of the current 254 flows through the Zener diode 220. If the resistance of the resistor 212 is large enough, a small portion of the current 254 flows through the resistor 212. Once the Zener diode 220 breaks down, the signal 246 (e.g., resetb) is close to the floating voltage 242. The inverter 224, in response, generates the signal 250 (e.g., at the logic high level) when the signal 246 falls below a threshold level of the inverter 224. When the transistor 208 is turned on by the pulse signal 236 (e.g., reset), the transistor 206 is off as the pulse signal 234 (e.g., set) is at the logic low level. The signal 240 (e.g., setb) is close to the voltage 244 (e.g., vddh). The inverter 222 generates the signal 248 (e.g., at the logic low level). The flip-flop 226 receives the signals 248 and 250, and generates the pre-gate-drive signal 252 (e.g., at the logic low level) that is received by the high-side gate driver 298.

For example, the maximum value of the current 238 that flows through the transistor 206 is often reduced by increasing the resistance of the resistor 214 in order to reduce power consumption and avoid damaging the transistor 206. In another example, the maximum value of the current 254 that flows through the transistor 208 is often reduced by increasing the resistance of the resistor 216.

But the level-shift circuit 204 has certain disadvantages. It is usually hard to optimize the resistance of $R_{up}$ (e.g., the resistor 210 or the resistor 212) and $R_{dn}$ (e.g., the resistor 214 or the resistor 216). On one hand, it is often desirable to have $R_{up}$ much larger than $R_{dn}$ to increase the turn-on speed of the level-shift circuit 204. For example, the resistor 210 (e.g., $R_{up}$) usually has a much larger resistance than the resistor 214 (e.g., $R_{dn}$), so that when the transistor 206 is turned on, a source current of the transistor 206 that flows through the resistor 210 is much smaller than a sink current of the transistor 206 that flows through the resistor 214 in magnitude. On the other hand, to avoid logic errors, the signal 240 (e.g., setb) or the signal 246 (e.g., resetb) often needs to change swiftly to the voltage 244 (e.g., vddh) after the pulse signal 234 (e.g., set) or the pulse signal 236 (e.g., reset) passes, respectively. For example, the resistance of the resistor 210 (e.g., $R_{up}$) usually needs to be reduced to increase the source current of the transistor 206. In another example, the resistor 214 (e.g., $R_{dn}$) often has a large resistance to limit a maximum current of the transistor 206 when the transistor 206 is turned on, and it is hard to choose a small resistance for the resistor 210 (e.g., $R_{up}$). Thus, the response speed of the level-shift circuit 204 is usually affected in certain high-frequency applications.

In addition, whether the level-shift circuit 204 can be turned on successfully for a first time often depends on the resistance of $R_{up}$ (e.g., the resistor 210 or the resistor 212) and $R_{dn}$ (e.g., the resistor 214 or the resistor 216). The first-time turn-on of the level-shift circuit 204 is usually a hard-switching operation. For example, before the level-shift circuit 204 is turned on for the first time, the floating voltage 242 is about 0 V, and the voltage 244 (e.g., vddh) is about 10 V. In another example, the turn-on resistance of the transistors 206 and 208 is about several kOhms. If the resistance of the resistor 210 (e.g., $R_{up}$) is small and the resistance of the resistor 214 (e.g., $R_{dn}$) is large, it is often hard to change the signal 240 (e.g., setb) below a logic low level recognizable by the following logic circuits (e.g., the inverter 222), and in turn output the signal 252 above the logic high level.

Further, the transistors 206 (e.g., HVNM1) and 208 (HVNM2) have large parasitic capacitances (e.g., the parasitic capacitors 228 and 230), respectively. For example, in certain soft-switching applications, the pulse signal 234 (e.g., set) arrives after the floating voltage 242 (e.g., HB) and the voltage 244 (e.g., vddh) increase to predetermined voltages, respectively (e.g., from 0 V to 400 V in 200 ns). In another example, during the process of the floating voltage 242 (e.g., HB) and the voltage 244 (e.g., vddh) increasing in magnitude, a charging current 262 is generated through the parasitic capacitor 228 and can be determined based on the following equation.

$$I_{ramp} = C_p \times dV/dt \qquad \text{(Equation 1)}$$

where $I_{ramp}$ represents the charging current 262, $C_p$ represents the capacitance of the capacitor 228, and dV/dt represents the changing speed of the floating voltage 242 (e.g., HB). For example, if $C_p$ is equal to 5 pF, and dV/dt is equal to 400V/200 ns, the charging current 262 is about 10 mA. In another example, the voltage drop on the resistor 210 (e.g., $R_{up}$) generated by the charging current 262 is large enough to break down the Zener diode 218, and cause logic errors.

As another example, in some soft-switching applications (e.g., applications of half-bridge gate drivers of series-parallel resonant converters (SPRC) or LLC resonant converters), the pulse signal 234 (e.g., set) arrives during the process of the floating voltage 242 and the voltage 244 (e.g., vddh) increasing in magnitude. But if the charging current 262 and a charging current 264 that is generated at the capacitor 230 break down the Zener diodes 218 and 220, respectively, the signal 240 (e.g., setb) and the signal 246 (e.g., resetb) are both close to the floating voltage 242. The level-shift circuit 204 may not output the signal 252 at the logic high level in response to the pulse signal 234 (e.g., set).

Moreover, the floating voltage 242 often changes from a low voltage (e.g., close to the ground voltage 266) to a high voltage (e.g., 400 V or higher). The level-shift circuit 204 usually is isolated from a die substrate in a high-voltage (e.g., greater than 500 V) isolation process that is often very expensive. A die is a block of semiconductor material, on which a functional circuit is fabricated.

FIG. 3(a) is a simplified conventional diagram showing another system with level shifting for controlling switches. The system 300 includes a signal generator 302, a high-side level-shift and gate driver component 304, a low-side gate driver 306, two switches 308 and 310, a capacitor 312, a diode 314 and an inductor 316. The signal generator 302, the high-side level-shift and gate driver component 304, and the low-side gate driver 306 are integrated into a single die 340.

For example, the system 300 is the same as the system 100. A high-voltage (e.g., greater than 500 V) isolation process is often needed to manufacture the system 300. For example, certain sub-components of the high-side level-shift and gate driver component 304 need to be isolated from the silicon substrate by at least 500 volts, resulting in very high manufacturing costs.

FIG. 3(b) is a simplified conventional diagram showing yet another system with level shifting for controlling switches. The system 350 includes a signal generator 352, a high-side level-shift and gate driver component 354, a low-side gate driver 356, two switches 358 and 360, a capacitor 362, a diode 364 and an inductor 366. The signal generator 352 and the low-side gate driver 356 are integrated into a die 370. The high-side level-shift and gate driver component 354 is integrated into another die 372. The dies 370 and 372 are packaged into a chip. For example, the system 350 is the same as the system 100. A bonding wire 374 connects the dies 370 and 372 for signal transmission. For example, a high-side modulation signal 368 (e.g., PWM_H) generated by the signal generator 352 is output from the die 370 via the wire 374 to the die 372 at a terminal 376 (e.g., PWM_IN). Usually, an expensive high-voltage (e.g., greater than 500 V) isolation process is still needed for manufacturing the system 350, even though the manufacturing cost of the system 350 is often less than that of the system 300.

Hence it is highly desirable to improve the techniques of level shifting for high voltage drivers.

3. BRIEF SUMMARY OF THE INVENTION

The present invention is directed to integrated circuits. More particularly, the invention provides level shifting for voltage drivers. Merely by way of example, the invention has been applied to half-bridge or full-bridge topologies (e.g., LLC resonant topologies). But it would be recognized that the invention has a much broader range of applicability.

According to one embodiment, a system for controlling one or more switches includes a first converting circuit, a second converting circuit, and a signal processing component. The first converting circuit is configured to convert a first current and generate a first converted voltage signal based on at least information associated with the first current. The second converting circuit is configured to convert a second current and generate a second converted voltage signal based on at least information associated with the second current. The signal processing component is configured to receive the first converted voltage signal and the second converted voltage signal and generate an output signal based on at least information associated with the first converted voltage signal and the second converted voltage signal. The signal processing component is further configured to generate the output signal at a first logic level if the second converted voltage signal is larger than the first converted voltage signal by at least a first predetermined magnitude. Additionally, the signal processing component is configured to generate the output signal at a second logic level if the first converted voltage signal is larger than the second converted voltage signal by at least a second predetermined magnitude, the second logic level being different from the first logic level.

According to another embodiment, a system for controlling one or more switches includes a first switch, a first current-sink component, a second switch, a second current-sink component, a first converting circuit, a second converting circuit, a first comparator, and a second comparator. The first switch is configured to receive a first input signal and allow at least a first current to flow through the first switch based on at least information associated with the first input signal. The first current-sink component is coupled to the first switch. The second switch is configured to receive a second input signal and allow at least a second current to flow through the second switch based on at least information associated with the second input signal. The second current-sink component is coupled to the second switch. The first converting circuit is configured to convert the first current and generate a first converted voltage signal based on at least information associated with the first current. The second converting circuit is configured to convert the second current and generate a second converted voltage signal based on at least information associated with the second current. The first comparator is configured to receive the first converted voltage signal and the second converted voltage signal and generate a first comparison signal based on at least information associated with the first converted voltage signal and the second converted voltage signal. The second comparator is configured to receive the first converted voltage signal and the second converted voltage signal and generate a second comparison signal based on at least information associated with the first converted voltage signal and the second converted voltage signal. Additionally, the first comparator is further configured to, if the second converted voltage signal is larger than the first converted voltage signal by at least a first predetermined magnitude, generate the first comparison signal at a first logic level. The second comparator is further configured to, if the first converted voltage signal is larger than the second converted voltage signal by at least a second predetermined magnitude, generate the second comparison signal at the first logic level.

According to yet another embodiment, a method for controlling one or more switches includes converting a first current to a first converted voltage signal based on at least information associated with the first current, converting a second current to a second converted voltage signal based on at least information associated with the second current, and receiving the first converted voltage signal and the second converted voltage signal. The method further includes processing the first converted voltage signal and the second converted voltage signal and generating an output signal based on at least information associated with the first converted voltage signal and the second converted voltage signal. The process for generating an output signal based on at least information associated with the first converted voltage signal and the second converted voltage signal includes generating the output signal at a first logic level if the second converted voltage signal is larger than the first converted voltage signal by at least a first predetermined magnitude, and generating the output signal at a second logic level if the first converted voltage signal is larger than the second converted voltage signal by at least a second predetermined magnitude, the second logic level being different from the first logic level.

According to yet another embodiment, a method for controlling one or more switches includes receiving a first input signal at a first switch, processing information associated with the first input signal, and allowing at least a first current to flow through the first switch based on at least information associated with the first input signal. The method further includes receiving a second input signal at a second switch, processing information associated with the second input signal, and allowing at least a second current to flow through the second switch based on at least information associated with the second input signal. Additionally, the method includes converting the first current to a first converted voltage signal based on at least information associated with the first current, converting the second current to a second converted voltage signal based on at least information associated with the second current, receiving the first converted voltage signal and the second converted voltage signal, and processing information associated with the first converted voltage signal and the second converted voltage signal. Furthermore, the method includes generating a first comparison signal based on at least information associated with the first converted voltage signal and the second converted voltage signal, the first comparison signal being at a first logic level if the second converted voltage signal is larger than the first converted voltage signal by at least a first predetermined magnitude. The method further includes generating a second comparison signal based on at least information associated with the first converted voltage signal and the second converted voltage signal, the second comparison signal being at the first logic level if the first converted voltage signal is larger than the second converted voltage signal by at least a second predetermined magnitude.

Many benefits are achieved by way of the present invention over conventional techniques. For example, some embodiments of the present invention provide a cost-effective circuit-partition approach to provide high-voltage isolation and reduce manufacturing costs. In another example, certain embodiments of the present invention provide a high-side high voltage level-shift circuit which can be used for gate drivers in half-bridge or full-bridge topologies, such as series-parallel resonant converters (SPRC) or inductor-inductor-capacitor (LLC) resonant converters. In yet another example, some embodiments of the present invention provide converting low-voltage input signals to high-voltage gate drive signals in various applications, such as soft-switching and hard-switching applications. In yet another example, certain embodiments of the present invention provide a level-shift circuit that changes a gate drive signal based on a difference between two pulse signals to increase a response speed for high-frequency applications, where a current-limiting resistor has a large resistance or a sink current is small in order to reduce power consumption. In yet another example, some embodiments of the present invention provide a current-sink component to limit a maximum current flowing through a high-voltage transistor to protect the transistor and provide a satisfactory input voltage for controlling switches. In yet another example, certain embodiments of the present invention provide a level-shift circuit to avoid changing a gate drive signal mistakenly during a ramp-up process of a floating ground voltage before an input pulse signal arrives. In yet another example, some embodiments of the present invention provide a level-shift circuit to recognize an input pulse signal that arrives during a ramp-up process of a floating ground voltage. In yet another example, certain embodiments of the present invention provide a level-shift circuit that has a high response speed in hard-switching operations.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

FIG. 3(*b*) is a simplified conventional diagram showing yet another system with level shifting for controlling switches.

5. DETAILED DESCRIPTION OF THE INVENTION

The present invention is directed to integrated circuits. More particularly, the invention provides level shifting for voltage drivers. Merely by way of example, the invention has been applied to half-bridge or full-bridge topologies (e.g., LLC resonant topologies). But it would be recognized that the invention has a much broader range of applicability.

Figure 1:
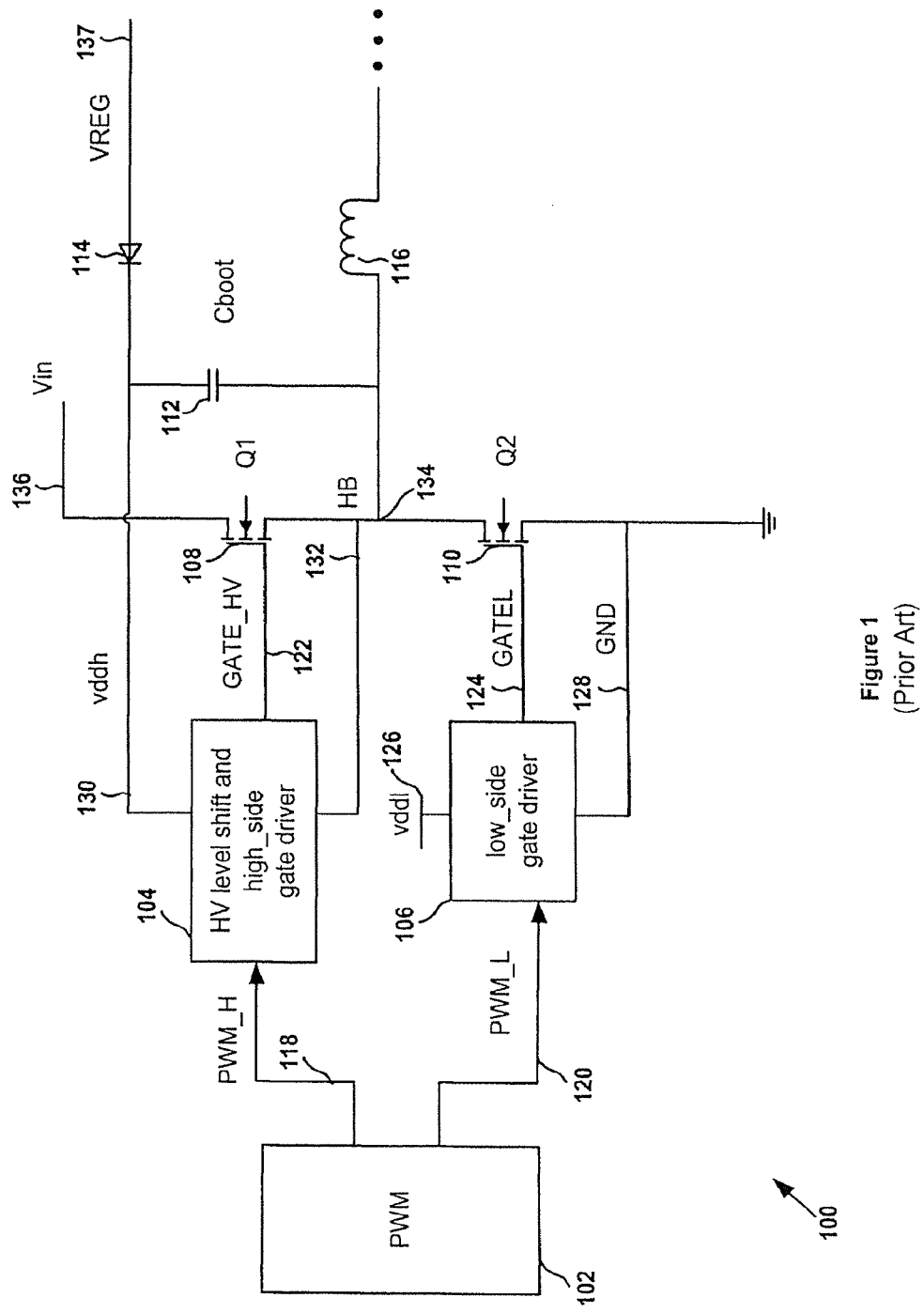
FIG. 1 is a simplified conventional diagram showing a system with level shifting for controlling switches.
Figure 2:
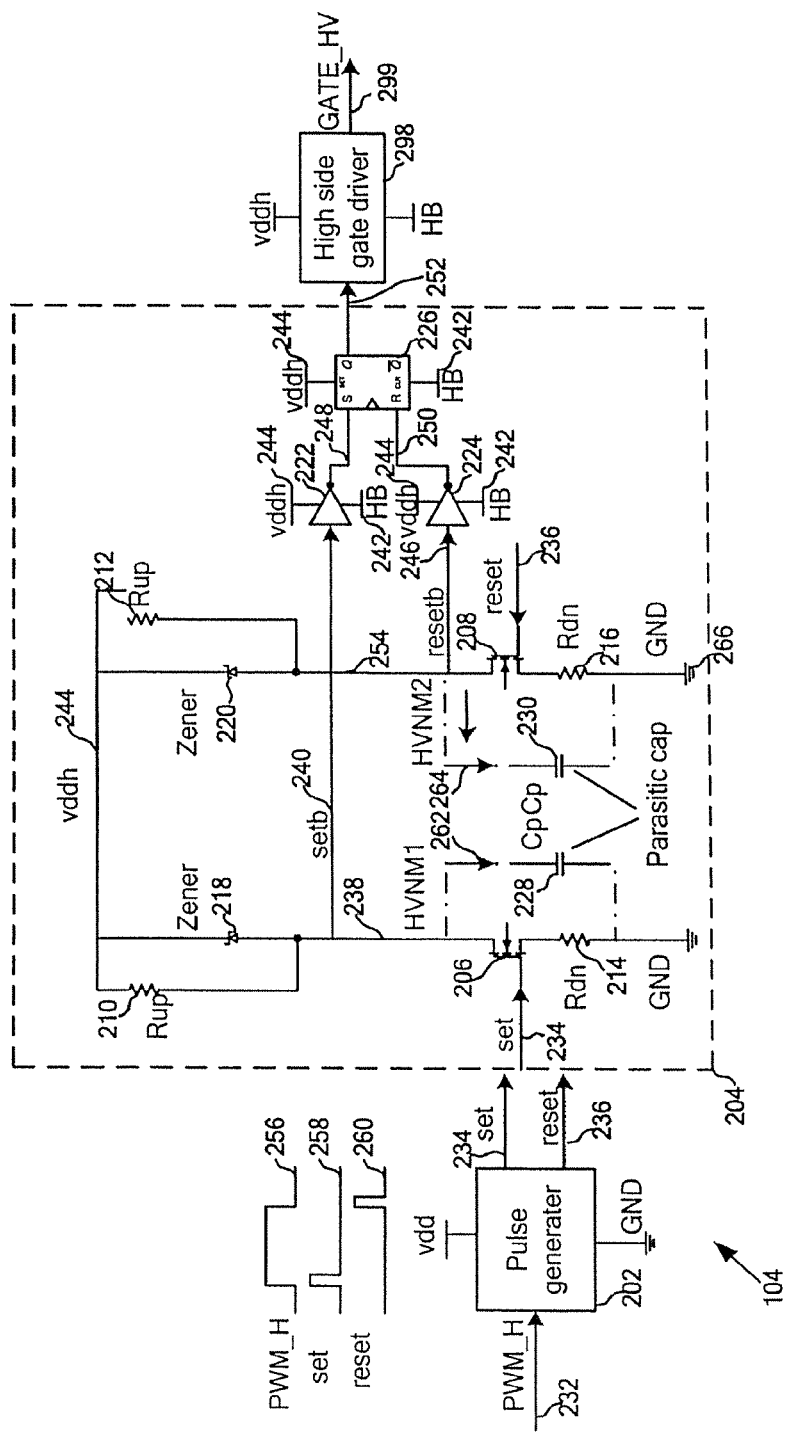
FIG. 2 is a simplified conventional diagram showing certain components of a high-side level-shift and gate driver component as part of the system shown in FIG. 1.
Figure 3A:
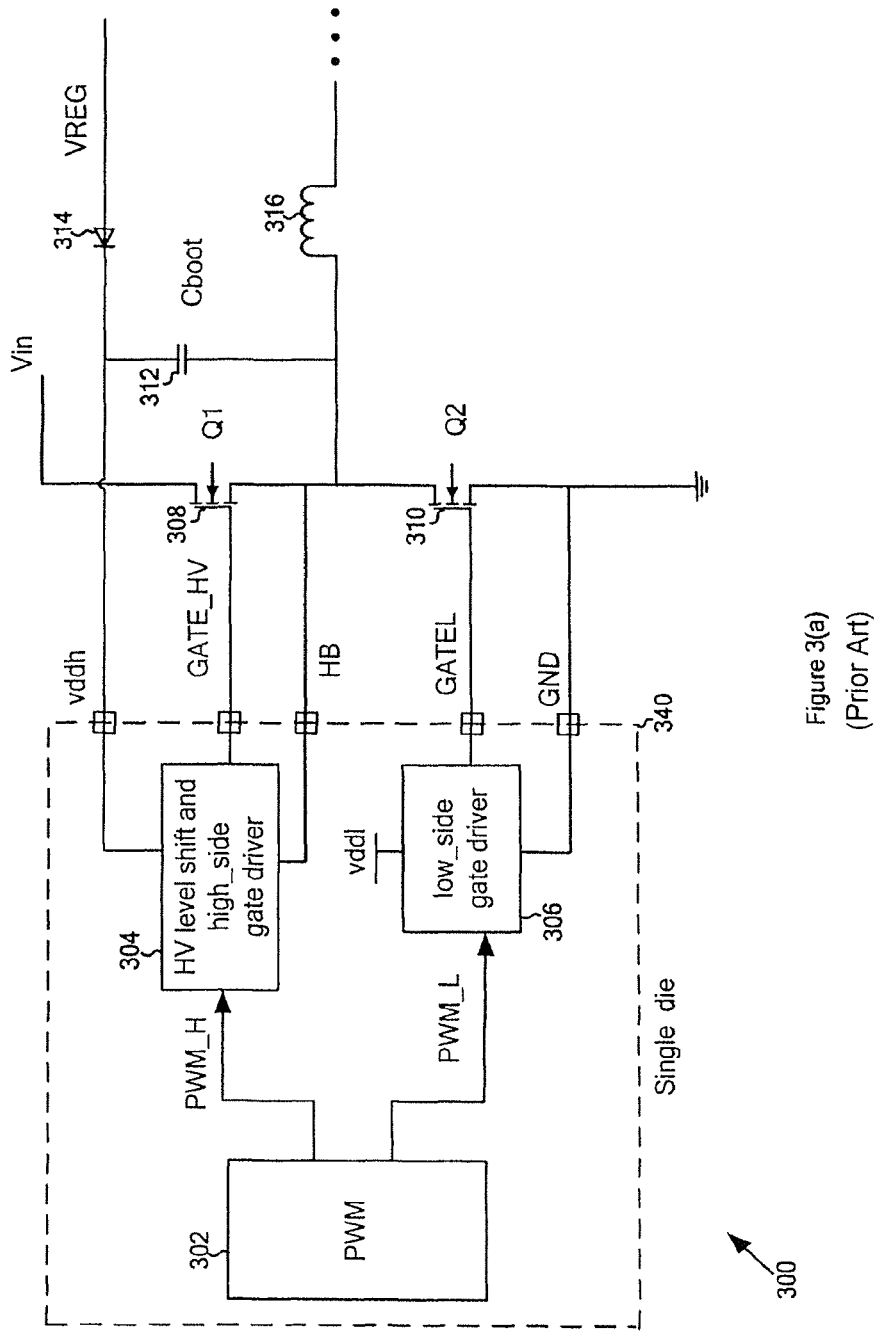
FIG. 3(*a*) is a simplified conventional diagram showing another system with level shifting for controlling switches.
Figure 3B:
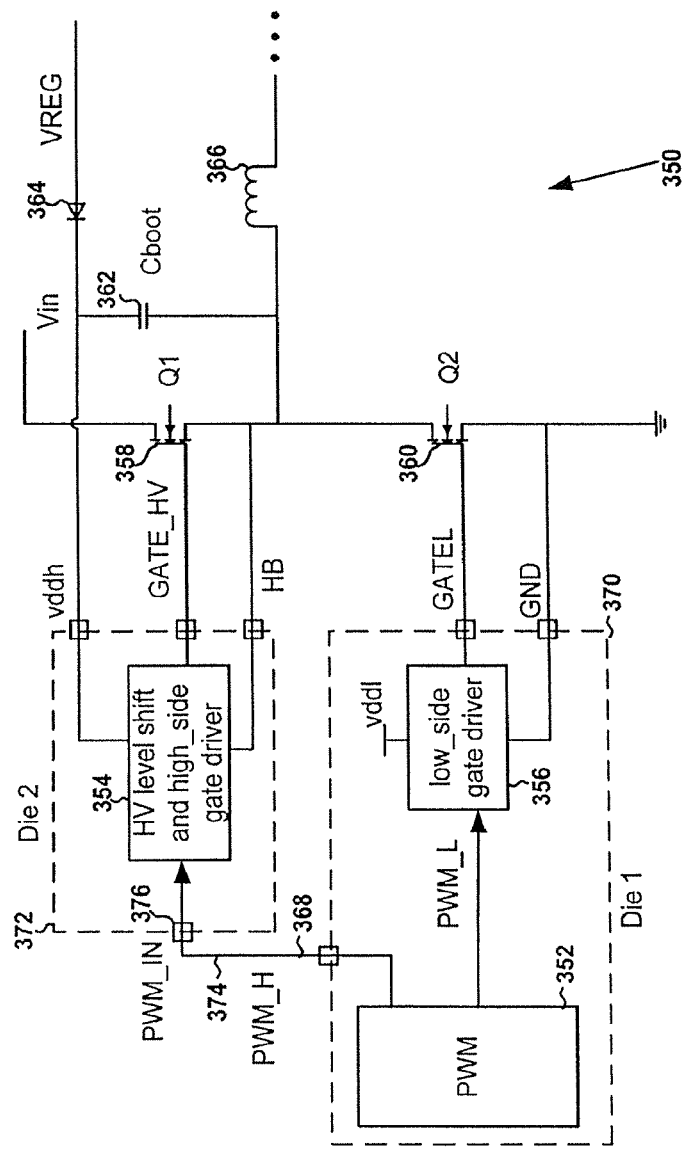
Figure 4:
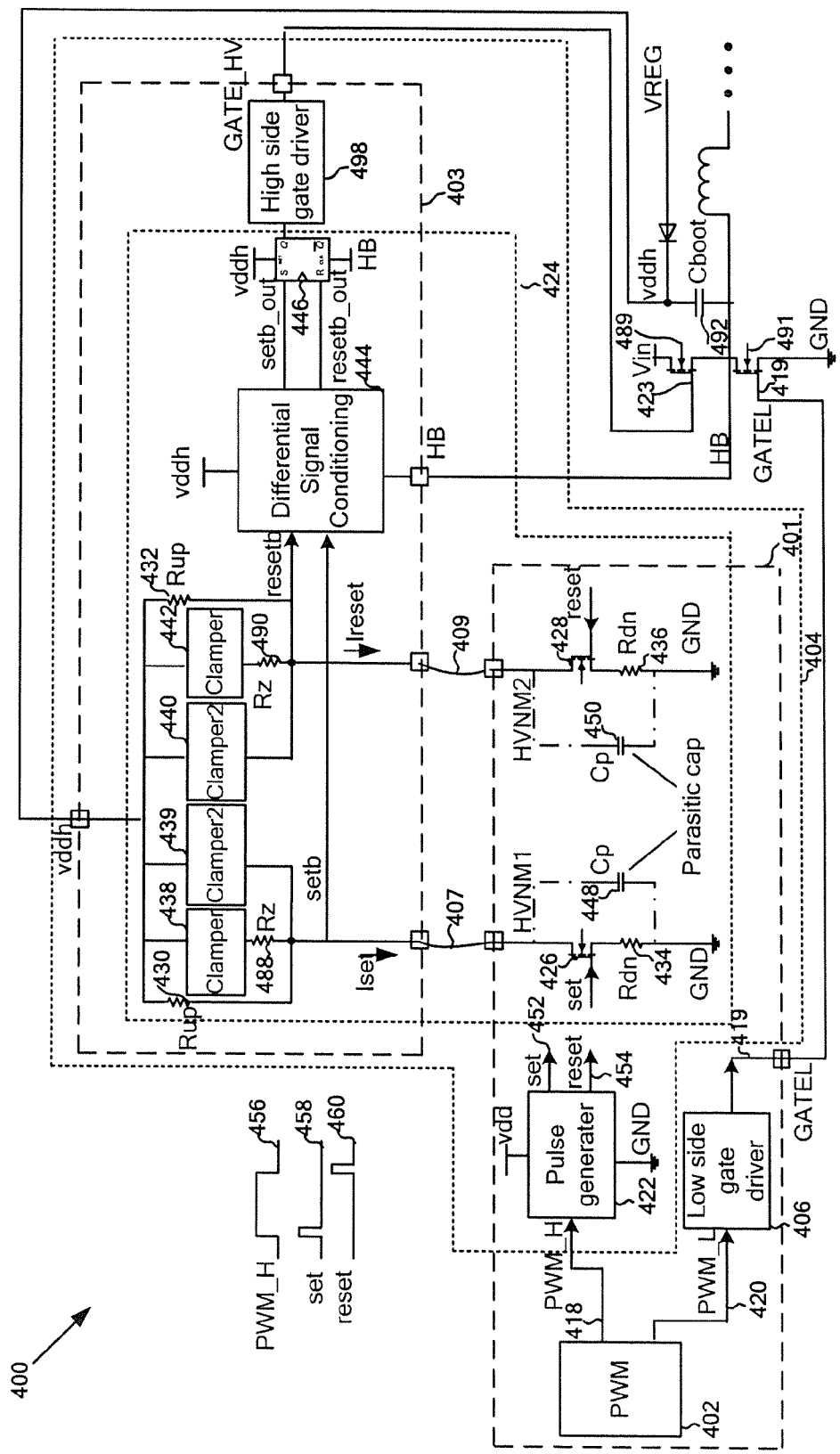
FIG. 4 is a simplified diagram showing a system with level shifting for controlling switches according to an embodiment of the present invention.

FIG. 4 is a simplified diagram showing a system with level shifting for controlling switches according to an embodiment of the present invention. This diagram is merely an example, which should not unduly limit the scope of the claims. One of ordinary skill in the art would recognize many variations, alternatives, and modifications. The system 400 includes a signal generator 402, a high-side level-shift and gate driver component 404, a low-side gate driver 406, two switches 489 and 491, and a capacitor 492. The high-side level-shift and gate driver component 404 includes a pulse generator 422, a level-shift circuit 424, and a high-side gate driver 498. The level-shift circuit 424 includes two transistors 426 and 428, six resistors 430, 432, 434, 436, 488, and 490, four clamper components 438, 439, 440 and 442, a differential-signal-conditioning component 444, and a flip-flop component 446. For example, the transistor 426 includes a parasitic capacitor 448, and the transistor 428 includes a parasitic capacitor 450. In another example, the transistors 426 and 428 are both N-channel MOSFETs. In yet another example, the transistors 426 and 428 sustain high drain-source voltages. In yet another example, the transistors 426 and 428 each sustain a maximum drain-source voltage of at least 400 volts. In yet another example, the signal generator 402 generates pulse-width-modulation (PWM) signals.

According to one embodiment, the signal generator 402, the low-side gate driver 406, the pulse generator 422, and certain components of the level-shift circuit 424 are integrated into a die 401. For example, the components of the level-shift circuit 424 that are integrated into the die 401 include the transistors 426 and 428 and the resistors 434 and 436. In another example, the high-side gate driver 498 and some components of the level-shift circuit 424 are integrated into another die 403, including the resistors 430, 432, 488 and 490, the clamper components 438, 439, 440 and 442, the differential-signal-conditioning component 444, and the flip-flop component 446. In yet another example, the circuitry in the die 403 are low-voltage circuitry. In yet another example, an expensive high-voltage isolation process is not needed due to the physical separation of the dies 401 and 403. In yet another example, the dies 401 and 403 are packaged into a chip.

According to another embodiment, the signal generator 402 generates a high-side modulation signal 418 (e.g., PWM_H) and a low-side modulation signal 420 (e.g., PWM_L). For example, the low-side gate driver 406 receives the low-side modulation signal 420 and in response outputs a low-side gate-drive signal 419 (e.g., GATEL) to drive the switch 491. In another example, the high-side level-shift and gate driver component 404 receives the high-side modulation signal 418 and in response outputs a high-side gate-drive signal 423 (e.g., GATE_HV) to drive the switch 489.

According to yet another embodiment, the pulse generator 422 receives the high-side modulation signal 418 (e.g., PWM_H as shown by a waveform 456). For example, the pulse generator 422, in response, generates a pulse signal 452 (e.g., set) at a rising edge of the high-side modulation signal 418 (e.g., as shown by a waveform 458). In another example, the pulse generator 422 also generates a pulse signal 454 (e.g., reset) at a falling edge of the high-side modulation signal 418 (e.g., as shown by a waveform 460). In yet another example, the pulse signals 452 and 454 are output to drive the transistors 426 and 428, respectively. In yet another example, the dies 401 and 403 are connected via bonding wires 407 and 409 for signal transmission. In yet another example, the transistor 426 receives signals from the circuitry in the die 403, and transmits signals to the circuitry in the die 403 through the bonding wire 407. In yet another example, the transistor 428 receives signals from the circuitry in the die 403, and transmits signals to the circuitry in the die 403 through the bonding wire 409.

Figure 5:
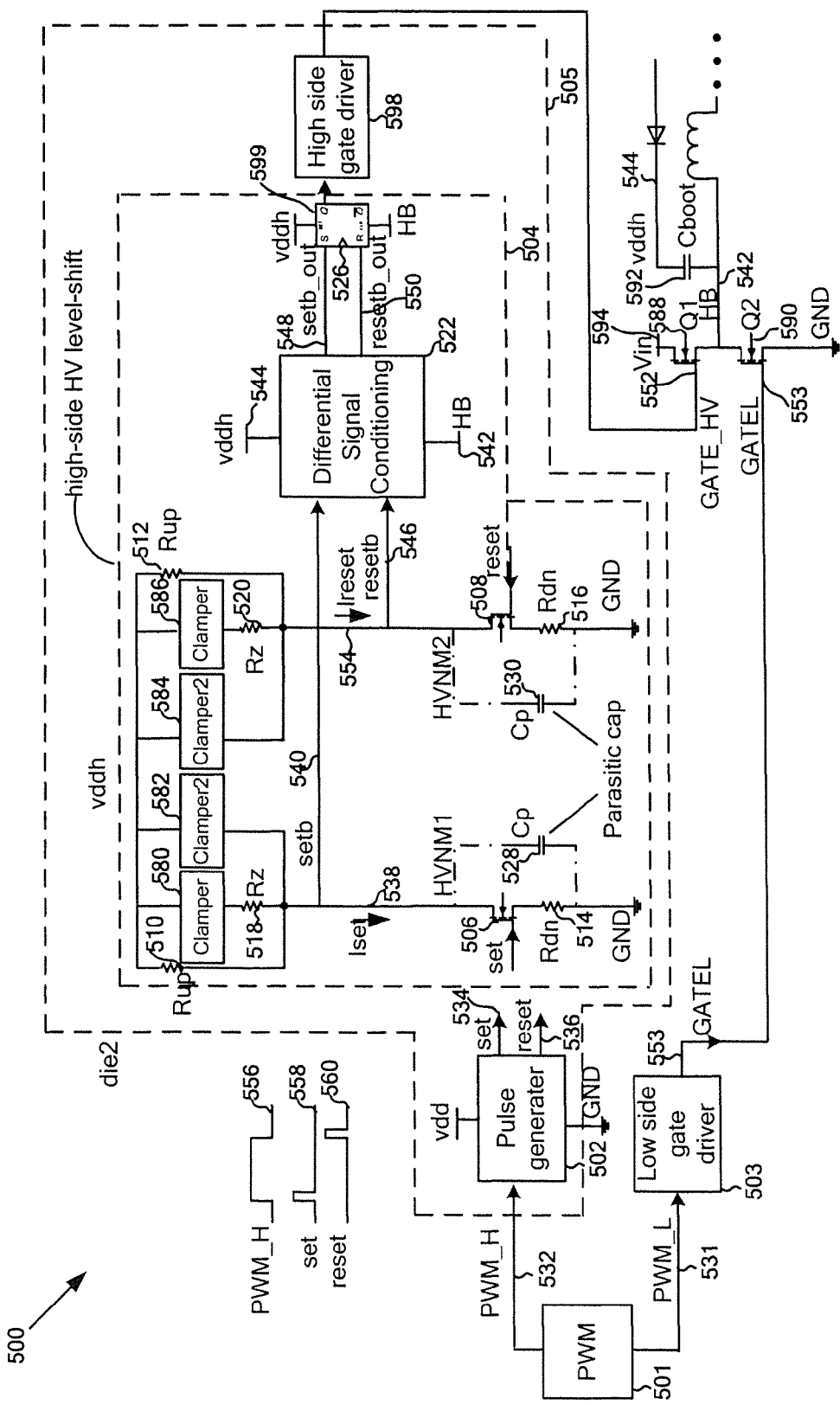
FIG. 5 is a simplified diagram showing a system with level shifting for controlling switches according to another embodiment of the present invention.

FIG. 5 is a simplified diagram showing a system with level shifting for controlling switches according to another embodiment of the present invention. This diagram is merely an example, which should not unduly limit the scope of the claims. One of ordinary skill in the art would recognize many variations, alternatives, and modifications.

The system 500 includes a signal generator 501, a low-side gate driver 503, a high-side level-shift and gate driver component 505, two switches 588 and 590, and a capacitor 592. The high-side level-shift and gate driver component 505 includes a pulse generator 502, a level-shift circuit 504, and a high-side gate driver 598. The level-shift circuit 504 includes two transistors 506 and 508, six resistors 510, 512, 514, 516, 518 and 520, four clamper component 580, 582, 584 and 586, a differential-signal-conditioning component 522, and a flip-flop component 526.

For example, the signal generator 501, the low-side gate driver 503, and the high-side level-shift and gate driver component 505 are the same as the signal generator 402, the low-side gate driver 406, and the high-side level-shift and gate driver component 404, respectively. In another example, the transistor 506 includes a parasitic capacitor 528, and the transistor 508 includes a parasitic capacitor 530. In yet another example, the transistors 506 and 508 are both N-channel MOSFETs. In yet another example, the transistors 506 and 508 are used as switches. In yet another example, the transistors 506 and 508 sustain high drain-source voltages (e.g., an input voltage 594). In yet another example, the transistors 506 and 508 each sustain a maximum drain-source voltage of at least 400 volts. In yet another example, the resistors 514 and 516 (e.g., $R_{dn}$) can be replaced with current-sink components. In yet another example, the switches 588 and 590 are transistors. In yet another example, the transistors 506 and 508 match with each other. In yet another example, the resistors 514 and 516 match with each other. In yet another example, the resistors 518 and 520 match with each other. In yet another example, the resistors 510 and 512 match with each other. In yet another example, the clamper components 580 and 586 match with each other. In yet another example, the clamper components 582 and 584 match with each other.

According to one embodiment, the resistors 514 and 516 are used to limit the maximum currents that flow through the transistors 506 and 508, respectively. For example, the resistors 514, 516, 518 and 520 are used to set a threshold voltage level for the differential-signal-conditioning component 522. In another example, the resistors 510 and 512 (e.g., $R_{up}$) are used to set the initial status of the system 500. In yet another example, the resistors 518 and 520 (e.g., $R_Z$) are used for generating differential voltage signals based on currents flowing through the transistors 506 and 508.

According to another embodiment, the signal generator 501 generates a high-side modulation signal 532 (e.g., PWM_H) and a low-side modulation signal 531 (e.g., PWM_L). For example, the low-side gate driver 503 receives the low-side modulation signal 531 and in response outputs a low-side gate-drive signal 553 (e.g., GATEL) to drive the switch 590. In another example, the high-side level-shift and gate driver component 505 receives the high-side modulation signal 532 and in response outputs a high-side gate-drive signal 552 (e.g., GATE_HV) to drive the switch 588.

According to yet another embodiment, the pulse generator 502 receives a modulation signal 532 (e.g., PWM_H as shown by a waveform 556). In yet another example, the pulse generator 502, in response, generates a pulse signal 534 (e.g., set) at a rising edge of the modulation signal 532 (e.g., as shown by a waveform 558). In yet another example, the pulse generator 502 also generates a pulse signal 536 (e.g., reset) at a falling edge of the modulation signal 532 (e.g., as shown by a waveform 560).

According to yet another embodiment, if the transistor 506 is turned on by the pulse signal 534 (e.g., set), a current 538 (e.g., $I_{set}$) flows through the transistor 506 (e.g., HVNM1) and the resistor 514 (e.g., $R_{dn}$). For example, a signal 540 (e.g., setb) is generated in response and is close to a floating voltage 542 (e.g., HB). In another example, when the transistor 506 is turned on by the pulse signal 534 (e.g., set), the transistor 508 (e.g., HVNM2) is off as the pulse signal 536 (e.g., reset) is at a logic low level. In yet another example, the voltage signal 546 (e.g., resetb) is close to a voltage 544 (e.g., vddh). In yet another example, under normal operating conditions (e.g., the floating voltage 542 is close to the input voltage 594), the clamper component 580 is used to keep the lowest value of the signal 540 (e.g., setb) no less than the floating voltage 542 (e.g., HB) in magnitude, and the clamper component 582 is not active. In yet another example, under certain operating conditions (e.g., the floating voltage 542 is not close to the input voltage 594), the clamper component 582 is active for circuit protection and used to ensure that the lowest value of the signal 540 (e.g., setb) is not much lower than the floating voltage 542 (e.g., HB) in magnitude. In yet another example, under the normal operating conditions, the lowest value of the signal 540 (e.g., setb) is equal to the sum of the voltage across the capacitor 592 (e.g., Cboot) and the floating voltage 542 (e.g., HB) minus a clamp voltage of the clamper component 580 (e.g., $V_{clamp}$). In yet another example, when the clamper component 582 is active under certain operating conditions, the lowest value of the signal 540 (e.g., setb) is equal to the sum of the voltage across the capacitor 592 (e.g., Cboot) and the floating voltage 542 (e.g., HB) minus a clamp voltage of the clamper component 582 (e.g., $V_{clamp2}$). In yet another example, the clamp voltage of the clamper component 582 (e.g., $V_{clamp2}$) is larger in magnitude than the clamp voltage of the clamper component 580 (e.g., $V_{clamp}$). In yet another example, the voltage 544 (e.g., vddh) is kept higher than the floating voltage 542 (e.g., HB) by a predetermined value (e.g., about 10 V).

If the transistor 508 is turned on by the pulse signal 536 (e.g., reset), a current 554 (e.g., $I_{reset}$) flows through the transistor 508 (e.g., HVNM2) and the resistor 516 (e.g., $R_{dn}$) according to certain embodiments. For example, a signal 546 (e.g., resetb) is generated in response to be close to the floating voltage 542 (e.g., HB). In another example, when the transistor 508 is turned on by the pulse signal 536 (e.g., reset), the transistor 506 is off as the pulse signal 534 (e.g., set) is at the logic low level. In yet another example, the signal 540 (e.g., setb) is close to the voltage 544 (e.g., vddh). In yet another example, under the normal operating conditions (e.g., the floating voltage 542 is close to the input voltage 594), the clamper component 586 is used to keep the lowest value of the signal 546 (e.g., resetb) no less than the floating voltage 542 (e.g., HB) in magnitude, and the clamper component 584 is not active. In yet another example, under certain operating conditions (e.g., the floating voltage 542 is not close to the input voltage 594), the clamper component 584 is active for circuit protection and used to ensure that the lowest value of the signal 546 (e.g., resetb) is not much lower than the floating voltage 542 (e.g., HB) in magnitude. In yet another example, under the normal operating conditions, the lowest value of the signal 546 (e.g., resetb) is equal to the sum of the voltage across the capacitor 592 (e.g., Cboot) and the floating voltage 542 (e.g., HB) minus a clamp voltage of the clamper component 586. In yet another example, when the clamper component 584 is active under certain operating conditions, the lowest value of the signal 546 (e.g., resetb) is equal to the sum of the voltage across the capacitor 592 (e.g., Cboot) and the floating voltage 542 (e.g., HB) minus a clamp voltage of the clamper component 584. In yet another example, the clamp voltage of the clamper component 584 is larger in magnitude than the clamp voltage of the clamper component 586.

In another embodiment, the differential-signal-conditioning component 522 receives the signal 540 (e.g., setb) and the signal 546 (e.g., resetb), and generates two output signals 548 and 550 based on the difference between the signals 540 and 546. For example, the flip-flop component 526 receives the output signals 548 and 550, and generates a pre-gate-drive signal 599. In another example, the high-side gate driver 598 receives the signal 599 and outputs the high-side gate-drive signal 552 (e.g., GATE_HV) to drive the switch 588.

Figure 6:
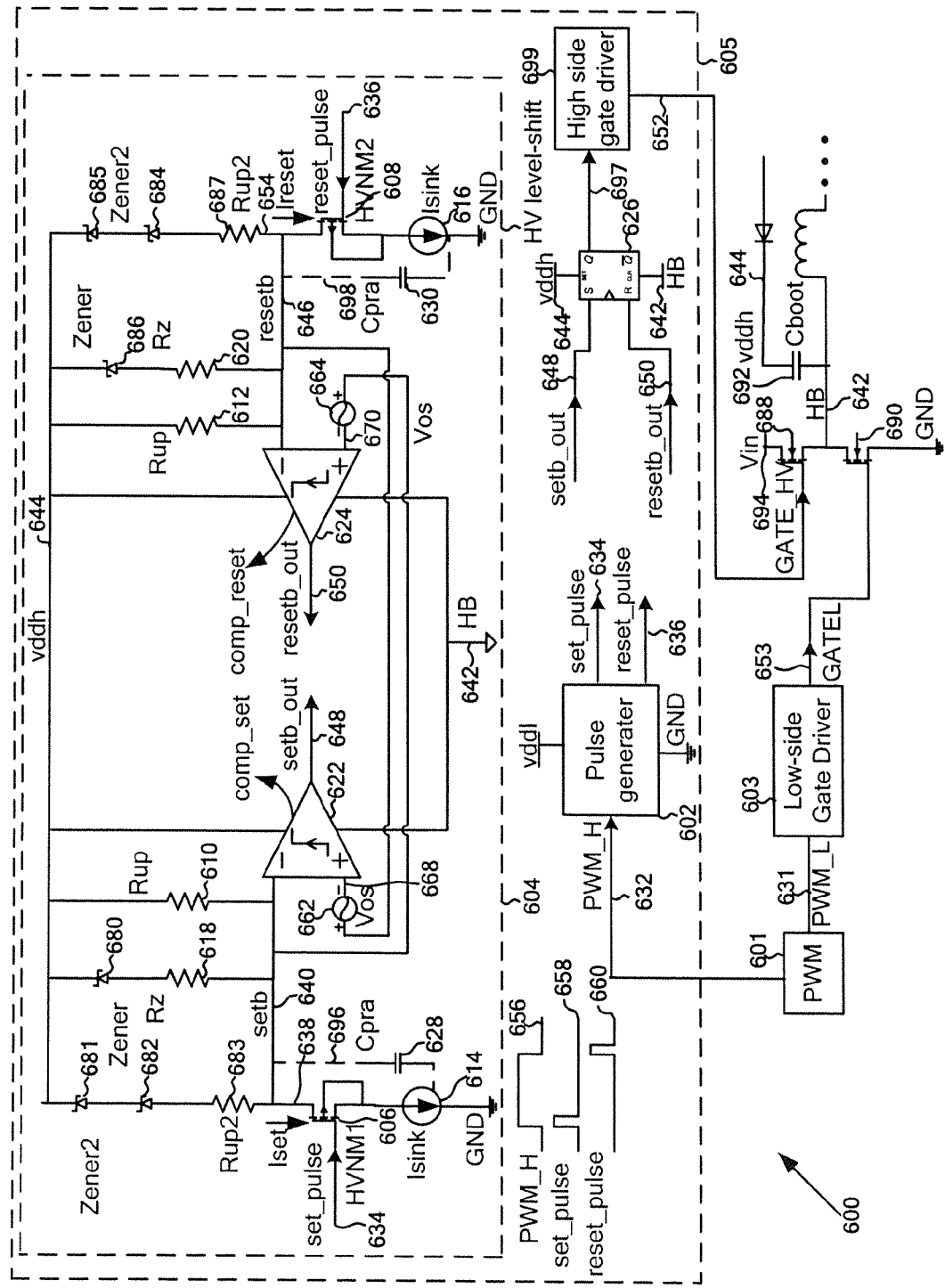
FIG. 6 is a simplified diagram showing a system with level shifting for controlling switches according to another embodiment of the present invention.

FIG. 6 is a simplified diagram showing a system with level shifting for controlling switches according to another embodiment of the present invention. This diagram is merely an example, which should not unduly limit the scope of the claims. One of ordinary skill in the art would recognize many variations, alternatives, and modifications.

The system 600 includes a signal generator 601, a low-side gate driver 603, a high-side level-shift and gate driver component 605, two switches 688 and 690, and a capacitor 692. The high-side level-shift and gate driver component 605 includes a pulse generator 602, a level-shift circuit 604, and a high-side gate driver 699. The level-shift circuit 604 includes two transistors 606 and 608, six resistors 610, 612, 618, 620, 683 and 687, two current-sink components 614 and 616, six Zener diodes 680, 681, 682, 684, 685 and 686, two comparators 622 and 624, two offset components 662 and 664, and a flip-flop component 626. For example, the transistor 606 includes a parasitic capacitor 628, and the transistor 608 includes a parasitic capacitor 630. In another example, the transistors 606 and 608 are both N-channel MOSFETs. In yet another example, the transistors 606 and 608 are used as switches. In yet another example, the transistors 606 and 608 can sustain high drain-source voltages (e.g., an input voltage 694). In yet another example, the transistors 606 and 608 each sustain a maximum drain-source voltage of at least 400 volts. In yet another example, the switches 688 and 690 are transistors. In yet another example, the transistors 606 and 608 match with each other. In yet another example, the current-sink components 614 and 616 match with each other. In yet another example, the resistors 618 and 620 match with each other. In yet another example, the resistors 610 and 612 match with each other. In yet another example, the Zener diodes 680 and 686 match with each other. In yet another example, the resistors 683 and 687 match with each other. In yet another example, the Zener diodes 681 and 685 match with each other. In yet another example, the Zener diodes 682 and 684 match with each other. In yet another example, the offset component 662 is part of the comparator 622. In yet another example, the offset component 664 is part of the comparator 624.

For example, the signal generator 601, the low-side gate driver 603, and the high-side level-shift and gate driver component 605 are the same as the signal generator 402, the low-side gate driver 406, and the high-side level-shift and gate driver component 404, respectively. In another example, the signal generator 601, the low-side gate driver 603, and the high-side level-shift and gate driver component 605 are the same as the signal generator 501, the low-side gate driver 503, and the high-side level-shift and gate driver component 505, respectively. In yet another example, the pulse generator 602, the transistors 606 and 608, the resistors 610, 612, 618 and 620, and a flip-flop component 626 are the same as the pulse generator 502, the transistors 506 and 508, the resistors 510, 512, 518 and 520, and a flip-flop component 526, respectively. In yet another example, the current-sink components 614 and 616 each include one or more resistors. In yet another example, the Zener diodes 681 and 682 are included in a clamper component (e.g., the clamper component 582). In yet another example, the Zener diodes 684 and 685 are included in a clamper component (e.g., the clamper component 584). In yet another example, the Zener diode 680 is included in a clamper component (e.g., the clamper component 580). In yet another example, the Zener diode 686 is included in a clamper component (e.g., the clamper component 586). In yet another example, the comparators 622 and 624, and the offset components 662 and 664 are included in a differential-signal-conditioning component (e.g., the component 522). In yet another example, the switches 688 and 690, and the capacitor 692 are the same as the switches 588 and 590, and the capacitor 592, respectively.

According to one embodiment, the current-sink components 614 and 616 are used to limit the maximum currents that flow through the transistors 606 and 608, respectively. For example, the current-sink component 614 and the resistor 618 are used to set a threshold voltage level for the comparator 622. In another example, the current-sink component 616 and the resistor 620 are used to set a threshold voltage level for the comparator 624. In another example, the resistors 610 and 612 (e.g., $R_{up}$) are used to set the initial status of the system 600. In yet another example, the resistors 618 and 620 (e.g., $R_Z$) are used for generating differential voltage signals based on currents flowing through the transistors 606 and 608.

According to another embodiment, the signal generator 601 generates a high-side modulation signal 632 (e.g., PWM_H) and a low-side modulation signal 631 (e.g., PWM_L). For example, the low-side gate driver 603 receives the low-side modulation signal 631 and in response outputs a low-side gate-drive signal 653 (e.g., GATEL) to drive the switch 690. In another example, the high-side level-shift and gate driver component 605 receives the high-side modulation signal 632 and in response outputs a high-side gate-drive signal 652 (e.g., GATE_HV) to drive the switch 688.

According to yet another embodiment, the pulse generator 602 receives a modulation signal 632 (e.g., PWM_H as shown by a waveform 656). For example, the pulse generator 602, in response, generates a pulse signal 634 (e.g., set_pulse) at a rising edge of the modulation signal 632 (e.g., as shown by a waveform 658). In another example, the pulse generator 602 also generates a pulse signal 636 (e.g., reset_pulse) at a falling edge of the modulation signal 632 (e.g., as shown by a waveform 660).

If the transistor 606 is turned on by the pulse signal 634 (e.g., set_pulse), a current 638 (e.g., $I_{set}$) flows through the transistor 606 (e.g., HVNM1) according to certain embodiments. For example, a signal 640 (e.g., setb) is generated in response and is close to a floating voltage 642 (e.g., HB). In another example, when the transistor 606 is turned on by the pulse signal 634 (e.g., set_pulse), the transistor 608 (e.g., HVNM2) is off as the pulse signal 636 (e.g., reset_pulse) is at a logic low level. In yet another example, the voltage signal 646 (e.g., resetb) is close to a voltage 644 (e.g., vddh) that is kept higher than the floating voltage 642 (e.g., HB) by a predetermined value (e.g., 10 V). In yet another example, under normal operating conditions (e.g., the floating voltage 642 is close to the input voltage 694), the Zener diode 680 is used to keep the lowest value of the signal 640 (e.g., setb) no less than the floating voltage 642 (e.g., HB) in magnitude. In yet another example, the Zener diodes 681 and 682, and the resistor 683 are inactive under the normal operating conditions, and active for circuit protection under certain operating conditions (e.g., the floating voltage 642 is not close to the input voltage 694). In yet another example, the Zener diodes 681 and 682, and the resistor 683, when active, are used to ensure that the lowest value of the signal 640 (e.g., setb) is not much lower than the floating voltage 642 (e.g., HB) in magnitude.

In another embodiment, if the transistor 608 is turned on by the pulse signal 636 (e.g., reset_pulse), a current 654 (e.g., $I_{reset}$) flows through the transistor 608 (e.g., HVNM2). For example, a signal 646 (e.g., resetb) is generated in response to be close to the floating voltage 642 (e.g., HB). In another example, when the transistor 608 is turned on by the pulse signal 636 (e.g., reset_pulse), the transistor 606 is off as the pulse signal 634 (e.g., set_pulse) is at the logic low level. In yet another example, the voltage signal 640 (e.g., setb) is close to the voltage 644 (e.g., vddh). In yet another example, under the normal operating conditions (e.g., the floating voltage 642 is close to the input voltage 694), the Zener diode 686 is used to keep the lowest value of the signal 646 (e.g., resetb) no less than the floating voltage 642 (e.g., HB) in magnitude. In yet another example, the Zener diodes 684 and 685, and the resistor 687 are inactive under the normal operating conditions, and active for circuit protection under certain operating conditions (e.g., the floating voltage 642 is not close to the input voltage 694). In yet another example, the Zener diodes 684 and 685, and the resistor 687, when active, are used to ensure that the lowest value of the signal 646 (e.g., resetb) is not much lower than the floating voltage 642 (e.g., HB) in magnitude.

In yet another embodiment, the offset component 662 receives the signal 646 (e.g., resetb) and generates an offset signal 668. For example, the comparator 622 receives the signal 640 (e.g., setb) at an inverting terminal and the offset signal 668 at a non-inverting terminal, and generates in response a comparison signal 648 (e.g., setb_out). In another example, the offset component 664 receives the signal 640 (e.g., setb) and generates an offset signal 670. In yet another example, the comparator 624 receives the signal 646 (e.g., resetb) at an inverting terminal and the offset signal 670 at a non-inverting terminal, and generates in response a comparison signal 650 (e.g., resetb_out). In yet another example, the flip-flop component 626 receives the signals 648 and 650, and generates a pre-gate-drive signal 697. In yet another example, the high-side gate driver 699 receives the pre-gate-drive signal 697 and outputs the high-side gate-drive signal 652 (e.g., GATE_HV) to drive the switch 688. In yet another example, the offset signal 668 is equal to the signal 646 (e.g., resetb) minus an offset, $V_{os}$, in magnitude, and the offset signal 670 is equal to the signal 640 (e.g., setb) minus the offset, $V_{os}$, in magnitude.

Figure 7:
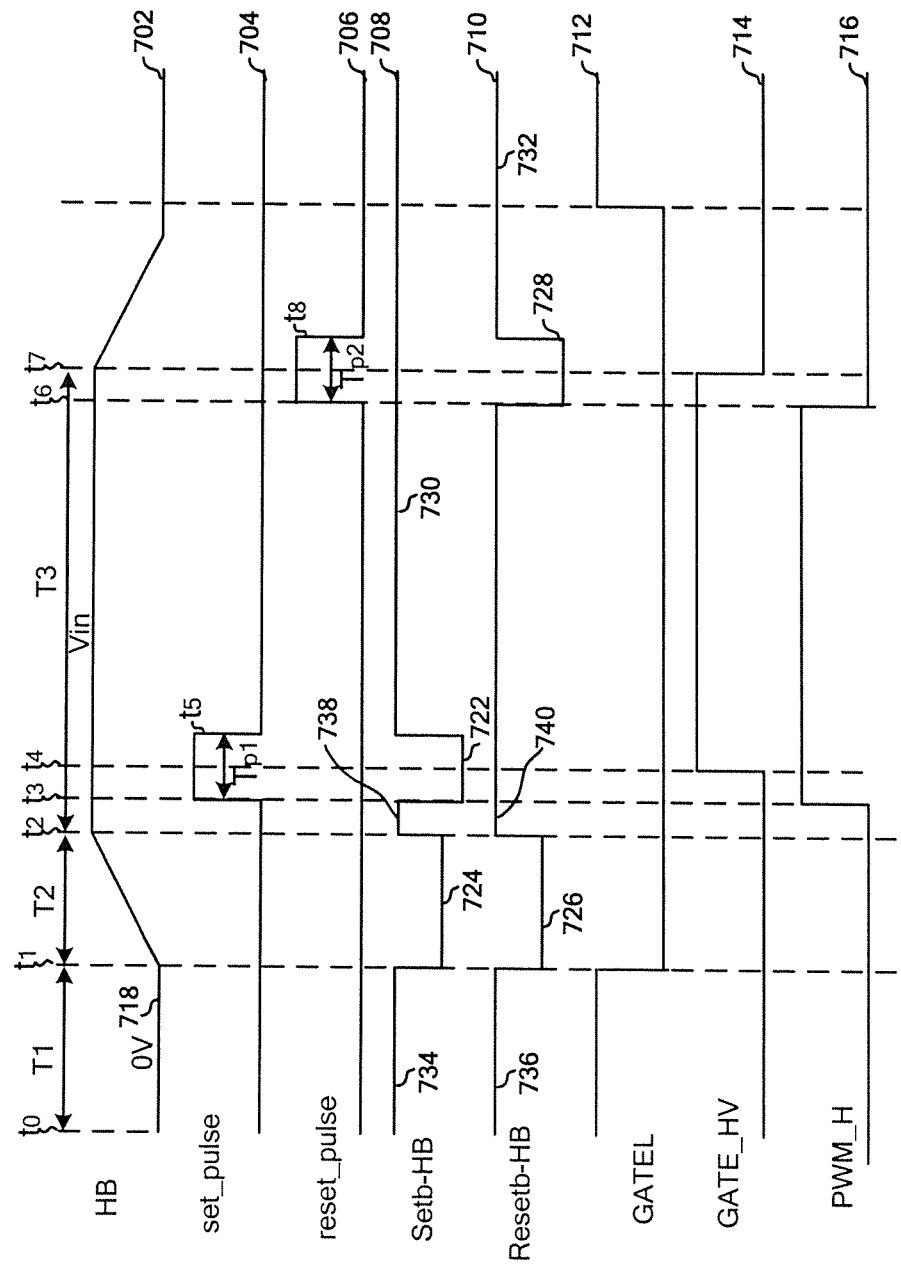
FIG. 7 is a simplified timing diagram for the system shown in FIG. 6 according to one embodiment of the present invention.

FIG. 7 is a simplified timing diagram for the system 600 according to one embodiment of the present invention. This diagram is merely an example, which should not unduly limit the scope of the claims. One of ordinary skill in the art would recognize many variations, alternatives, and modifications.

As shown in FIG. 7, the waveform 702 represents the floating voltage 642 (e.g., HB) as a function of time, the waveform 704 represents the pulse signal 634 (e.g., set_pulse) as a function of time, and the waveform 706 represents the pulse signal 636 (e.g., reset_pulse) as a function of time. Additionally, the waveform 708 represents the voltage signal 640 (e.g., setb) minus the floating voltage 642 (e.g., HB) as a function of time, the waveform 710 represents the voltage signal 646 (e.g., resetb) minus the floating voltage 642 (e.g., HB) as a function of time, and the waveform 712 represents the low-side gate-drive signal 653 (e.g., GATEL) as a function of time. Moreover, the waveform 714 represents the high-side gate-drive signal 652 (e.g., GATE_HV) as a function of time, and the waveform 716 represents the high-side modulation signal 632 (e.g., PWM_H) as a function of time.

Five time periods $T_1$, $T_2$, $T_3$, $T_{p1}$ and $T_{p2}$ are shown in FIG. 7. The time period $T_1$ starts at time $t_0$ and ends at time $t_1$, the time period $T_2$ starts at time $t_1$ and ends at time $t_2$, and the time period $T_3$ starts at time $t_2$ and ends at time $t_7$. Additionally, the time period $T_{p1}$ starts at time $t_3$ and ends at time $t_5$, and the time period $T_{p2}$ starts at time $t_6$ and ends at time $t_8$. For example, the times $t_3$, $t_4$, $t_5$ and $t_6$ are within the time period $T_3$. In another example, $t_0 \leq t_1 \leq t_2 \leq t_3 \leq t_4 \leq t_5 \leq t_6 \leq t_7$. In yet another example, the lengths of the time period $T_{p1}$ and $T_{p2}$ are the same.

According to one embodiment, during the time period $T_1$, the high-side modulation signal 632 (e.g., PWM_H) keeps at a logic low level (e.g., as shown by the waveform 716). For example, the floating voltage 642 (e.g., HB) keeps at a low value 718 (e.g., 0 V as shown by the waveform 702). In another example, the signal 634 (e.g., set_pulse) keeps at the logic low level (e.g., as shown by the waveform 704), and the transistor 606 is not turned on. In yet another example, the voltage signal 640 (e.g., setb) is approximately equal to the voltage 644 (e.g., vddh), and the voltage signal 640 (e.g., setb) minus the floating voltage 642 is equal to a value 734 in magnitude (e.g., as shown by the waveform 708). In yet another example, the signal 636 (e.g., reset_pulse) keeps at the logic low level (e.g., as shown by the waveform 706), and the transistor 608 is not turned on. In yet another example, the voltage signal 646 (e.g., resetb) is approximately equal to the voltage 644 (e.g., vddh), and the voltage signal 646 (e.g., resetb) minus the floating voltage 642 is equal to a value 736 in magnitude (e.g., as shown by the waveform 710). In yet another example, the low-side gate drive signal 653 (e.g., GATEL) keeps at a logic high level (e.g., as shown by the waveform 712), and the high-side gate drive signal 652 (e.g., GATE_HV) keeps at the logic low level (e.g., as shown by the waveform 714).

According to another embodiment, during the time period $T_2$, the floating voltage 642 (e.g., HB) increases in magnitude from the low value 718 (e.g., at $t_1$) to the input voltage 694 (e.g., $V_{in}$ at $t_2$) as shown by the waveform 702. For example, the voltage 644 (e.g., vddh) increases as the floating voltage increases and is kept larger than the floating voltage 642 by a predetermined value (e.g., 10 V). In another example, during the process of the floating voltage 642 (e.g., HB) increasing in magnitude, large charging currents 696 and 698 are generated through the parasitic capacitors 628 and 630, respectively. In yet another example, the charging currents 696 and 698 are large enough to break down the Zener diodes 680 and 686, respectively. In yet another example, a large portion of the current 696 flows through the resistor 618 (e.g., $R_Z$) and the Zener diode 680, and a small portion of the current 696 flows through the resistor 610 (e.g., $R_{up}$). In yet another example, a large portion of the current 698 flows through the resistor 620 (e.g., $R_Z$) and the Zener diode 686, and a small portion of the current 698 flows through the resistor 612 (e.g., $R_{up}$). In yet another example, the signal 640 (e.g., setb) minus the floating voltage 642 (e.g., HB) is equal to the voltage 644 (e.g., vddh) minus the voltage drop across the resistor 618 (e.g., $R_Z$) and the Zener diode 680 in magnitude (e.g., as shown by the waveform 708). In yet another example, the signal 640 (e.g., setb) minus the floating voltage 642 (e.g., HB) keeps at a value 724 during the time period $T_2$. In yet another example, the signal 646 (e.g., resetb) minus the floating voltage 642 (e.g., HB) is equal to the voltage 644 (e.g., vddh) minus the voltage drop across the resistor 620 (e.g., $R_Z$) and the Zener diode 686 in magnitude (e.g., as shown by the waveform 710). In yet another example, the signal 646 (e.g., resetb) minus the floating voltage 642 (e.g., HB) keeps at a value 726 during the time period $T_2$. In yet another example, due to the offset (e.g., $V_{os}$) generated by the offset components 662 and 664, the comparison signal 648 (e.g., setb_out) and the comparison signal 650 (e.g., resetb_out) do not change logic levels. Thus, the increase (e.g., ramping up) of the floating voltage 642 does not cause logic errors to the output of the level-shift circuit 604 according to certain embodiments. For example, the high-side gate drive signal 652 (e.g., GATE_HV) remains at the logic low level during the time period $T_2$ (e.g., as shown by the waveform 714). In another example, the low-side gate drive signal 653 (e.g., GATEL) changes from a logic high level to the logic low level at the beginning of the time period $T_2$ (e.g., at $t_1$), and keeps at the logic low level during the time period $T_2$ (e.g., as shown by the waveform 712).

In one embodiment, at the beginning of the time period $T_3$ (e.g., at $t_2$), the process of the floating voltage 642 (e.g., HB) increasing in magnitude ends, and the floating voltage 642 is equal to the input voltage 694 (e.g., $V_{in}$) in magnitude (e.g., as shown by the waveform 702). For example, the signal 640 (e.g., setb) minus the floating voltage 642 (e.g., HB) increases in magnitude from the value 724 to a value 738 (e.g., at $t_2$ as shown by the waveform 708). In another example, the signal 646 (e.g., resetb) minus the floating voltage 642 (e.g., HB) increases in magnitude from the value 726 to a value 740 (e.g., as shown by the waveform 710). In yet another example, during the time period $T_3$, the floating voltage 642 (e.g., HB) keeps equal to the input voltage 694 (e.g., $V_{in}$) in magnitude (e.g., as shown by the waveform 702). In yet another example, the value 738 is approximately equal to the voltage 644 (e.g., vddh) minus the floating voltage 642 (e.g., HB) in magnitude. In yet another example, the value 740 is approximately equal to the voltage 644 (e.g., vddh) minus the floating voltage 642 (e.g., HB) in magnitude.

In another embodiment, at the beginning of the time period $T_{p1}$ (e.g., at $t_3$), the modulation signal 632 (e.g., PWM_H) changes from the logic low level to the logic high level (e.g., a rising edge as shown by the waveform 716). For example, the pulse signal 634 (e.g., set_pulse) changes from the logic low level to the logic high level (e.g., at $t_3$), keeps at the logic high level for the time period $T_{p1}$, and changes back to the logic low level after the time period $T_{p1}$ (e.g., at $t_5$ as shown by the waveform 704). In another example, during the time period $T_{p1}$, the transistor 606 is turned on by the pulse signal 634 (e.g., set_pulse). In yet another example, the signal 640 (e.g., setb) minus the floating voltage 642 (e.g., HB) decreases in magnitude from the value 738 to a value 722 (e.g., at $t_3$), keeps at the value 722 for the time period $T_{p1}$, and increases in magnitude from the value 722 to a value 730 after the time period $T_{p1}$ (e.g., at $t_5$ as shown by the waveform 708). In yet another example, during the time period $T_{p1}$, the pulse signal 636 (e.g., reset_pulse) keeps at the logic low level (e.g., as shown by the waveform 706), and the transistor 608 remains off. In yet another example, the signal 646 (e.g., resetb) minus the floating voltage 642 keeps at the value 740 in magnitude (e.g., as shown by the waveform 710). In yet another example, during the time period $T_{p1}$, the signal 640 (e.g., setb) is smaller, in magnitude, than the offset signal 668 that is equal to the signal 646 (e.g., resetb) minus the offset $V_{os}$. In yet another example, the comparison signal 648 (e.g., setb_out) changes from the logic low level to the logic high level. In yet another example, the high-side gate drive signal 652 (e.g., GATE_HV) changes from the logic low level to the logic high level (e.g., at $t_4$ as shown by the waveform 714).

In yet another embodiment, at the beginning of the time period $T_{p2}$ (e.g., at $t_6$), the modulation signal 632 (e.g., PWM_H) changes from the logic high level to the logic low level (e.g., a falling edge as shown by the waveform 716). For example, the pulse signal 636 (e.g., reset_pulse) changes from the logic low level to the logic high level (e.g., at $t_6$), keeps at the logic high level for the time period $T_{p2}$, and changes back to the logic low level after the time period $T_{p2}$ (e.g., at $t_8$ as shown by the waveform 706). In another example, the transistor 608 is turned on by the pulse signal 636 (e.g., reset_pulse) during the time period $T_{p2}$. In yet another example, the signal 646 (e.g., resetb) minus the floating voltage 642 (e.g., HB) decreases in magnitude from the value 740 to a value 728 (e.g., at $t_6$), keeps at the value 728 for the time period $T_{p2}$, and increases in magnitude from the value 728 to a value 732 after the time period $T_{p2}$ (e.g., at $t_8$ as shown by the waveform 710). In yet another example, during the time period $T_{p2}$, the pulse signal 634 (e.g., set_pulse) is at the logic low level (e.g., as shown by the waveform 704). In yet another example, the transistor 606 remains off, and the signal 640 (e.g., setb) minus the floating voltage 642 (e.g., HB) keeps at the value 730 (e.g., as shown by the waveform 708). In yet another example, during the time period $T_{p2}$, the signal 646 (e.g., resetb) is smaller, in magnitude, than the offset signal 670 that is equal to the signal 640 (e.g., setb) minus the offset $V_{os}$. In yet another example, the comparison signal 650 (e.g., reset-b_out) changes from the logic low level to the logic high level. In yet another example, the high-side gate drive signal 652 (e.g., GATE_HV) changes from the logic high level to the logic low level (e.g., at $t_7$ as shown by the waveform 714). In yet another example, the floating voltage 642 (e.g., HB) decreases in magnitude from the input voltage 694 (e.g., $V_{in}$ at $t_7$ as shown by the waveform 702). In yet another example, the value 730 is approximately equal to the voltage 644 (e.g., vddh) minus the floating voltage 642 (e.g., HB) in magnitude. In yet another example, the value 732 is approximately equal to the voltage 644 (e.g., vddh) minus the floating voltage 642 (e.g., HB) in magnitude.

Figure 8:
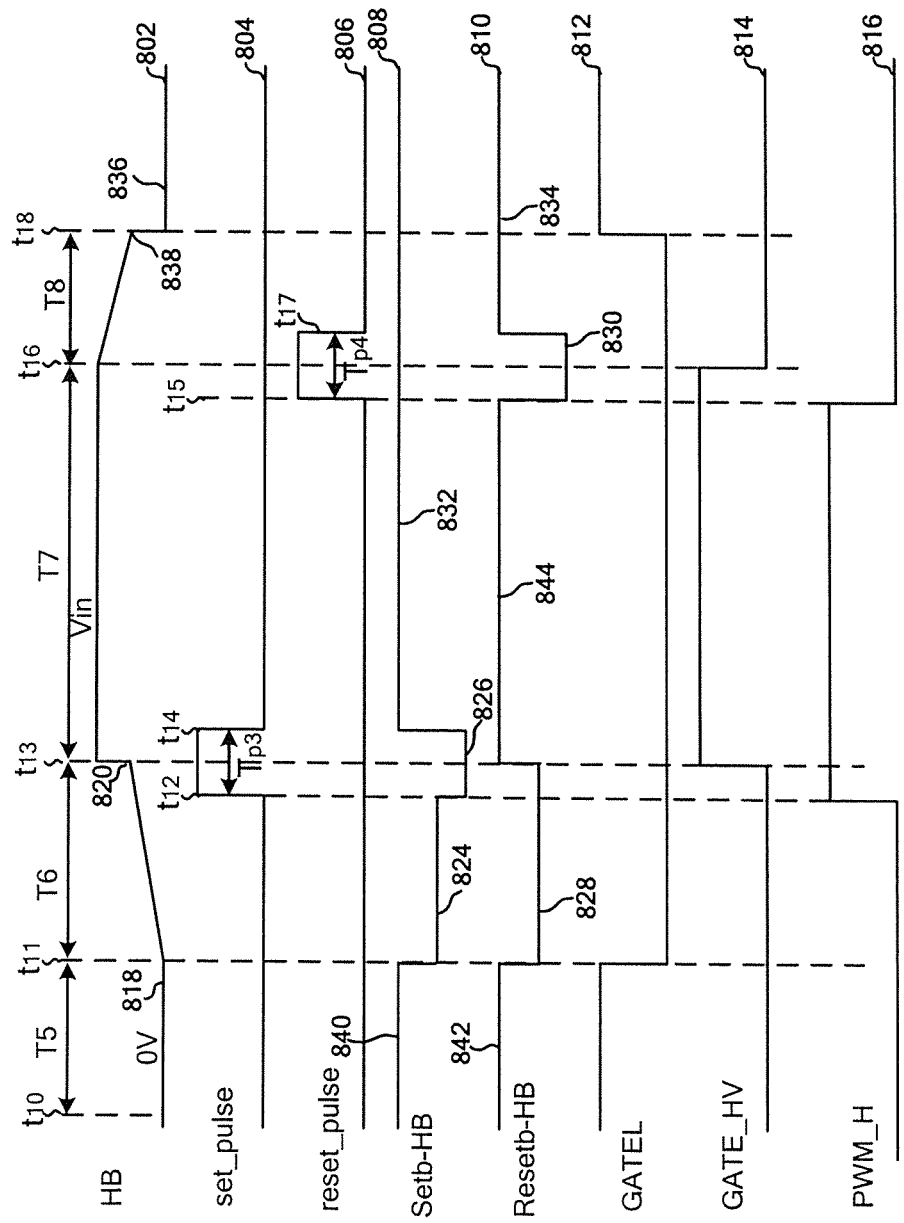
FIG. 8 is a simplified timing diagram for the system shown in FIG. 6 according to another embodiment of the present invention.

FIG. 8 is a simplified timing diagram for the system 600 according to another embodiment of the present invention. This diagram is merely an example, which should not unduly limit the scope of the claims. One of ordinary skill in the art would recognize many variations, alternatives, and modifications.

As shown in FIG. 8, the waveform 802 represents the floating voltage 642 (e.g., HB) as a function of time, the waveform 804 represents the pulse signal 634 (e.g., set_pulse) as a function of time, and the waveform 806 represents the pulse signal 636 (e.g., reset_pulse) as a function of time. Additionally, the waveform 808 represents the voltage signal 640 (e.g., setb) minus the floating voltage 642 (e.g., HB) as a function of time, the waveform 810 represents a voltage signal 646 (e.g., resetb) minus the floating voltage 642 (e.g., HB) as a function of time, and the waveform 812 represents the low-side gate-drive signal 653 (e.g., GATEL) as a function of time. Moreover, the waveform 814 represents the high-side gate-drive signal 652 (e.g., GATE_HV) as a function of time, and the waveform 816 represents the high-side modulation signal 632 (e.g., PWM_H) as a function of time.

Six time periods $T_5$, $T_6$, $T_7$, $T_8$, $T_{p3}$ and $T_{p4}$ are shown in FIG. 8. The time period $T_5$ starts at time $t_{10}$ and ends at time $t_{11}$, the time period $T_6$ starts at time $t_{11}$ and ends at time $t_{13}$, the time period $T_7$ starts at time $t_{13}$ and ends at time $t_{16}$, and the time period $T_8$ starts at time $t_{16}$ and ends at time $t_{18}$. Additionally, the time period $T_{p3}$ starts at time $t_{12}$ and ends at time $t_{14}$, and the time period $T_{p4}$ starts at time $t_{15}$ and ends at time $t_{17}$. For example, the time $t_{12}$ is within the time period $T_6$, the times $t_{14}$ and $t_{15}$ are within the time period $T_7$, and the time $t_{17}$ is within the time period $T_8$. In another example, $t_{10} \leq t_{11} \leq t_{12} \leq t_{13} \leq t_{14} \leq t_{15} \leq t_{16} \leq t_{17} \leq t_{18}$. In yet another example, the lengths of the time period $T_{p3}$ and $T_{p4}$ are the same.

According to one embodiment, during the time period $T_5$, the high-side modulation signal 632 (e.g., PWM_H) keeps at a logic low level (e.g., as shown by the waveform 816). For example, the low-side gate drive signal 653 (e.g., GATEL) keeps at a logic high level (e.g., as shown by the waveform 812), and the high-side gate drive signal 652 (e.g., GATE_HV) keeps at the logic low level (e.g., as shown by the waveform 814). In another example, the floating voltage 642 (e.g., HB) keeps at a low value 818 (e.g., 0 V as shown by the waveform 802). In yet another example, the signal 634 (e.g., set_pulse) keeps at the logic low level (e.g., as shown by the waveform 804), and the transistor 606 is not turned on. In yet another example, the voltage signal 640 (e.g., setb) is approximately equal to the voltage 644 (e.g., vddh), and the voltage signal 640 (e.g., setb) minus the floating voltage 642 is equal to a value 840 in magnitude (e.g., as shown by the waveform 808). In yet another example, the signal 636 (e.g., reset_pulse) keeps at the logic low level (e.g., as shown by the waveform 806), and the transistor 608 is not turned on. In yet another example, the voltage signal 646 (e.g., resetb) is approximately equal to the voltage 644 (e.g., vddh), and the voltage signal 646 (e.g., resetb) minus the floating voltage 642 is equal to a value 842 in magnitude (e.g., as shown by the waveform 810).

According to another embodiment, during the time period $T_6$, the floating voltage 642 (e.g., HB) increases in magnitude from the low value 818 (e.g., at $t_{11}$) to a high value 820 (e.g., at $t_{13}$) as shown by the waveform 802. For example, the voltage 644 (e.g., vddh) increases as the floating voltage 642 (e.g., HB) increases, and is kept larger than the floating voltage 642 by a predetermined value (e.g., 10 V). In another example, during the process of the floating voltage 642 (e.g., HB) increasing in magnitude, large charging currents 696 and 698 are generated through the parasitic capacitors 628 and 630, respectively. In yet another example, the charging currents 696 and 698 are large enough to break down the Zener diodes 680 and 686, respectively. In yet another example, the signal 640 (e.g., setb) minus the floating voltage 642 (e.g., HB) is equal to the voltage 644 (e.g., vddh) minus the voltage drop across the resistor 618 (e.g., $R_Z$) and the Zener diode 680 in magnitude (e.g., as shown by the waveform 808). In yet another example, the signal 640 (e.g., setb) minus the floating voltage 642 (e.g., HB) keeps at a value 824 during the time period $T_6$. In yet another example, the signal 646 (e.g., resetb) minus the floating voltage 642 (e.g., HB) is equal to the voltage 644 (e.g., vddh) minus the voltage drop across the resistor 620 (e.g., $R_Z$) and the Zener diode 686 in magnitude (e.g., as shown by the waveform 810). In yet another example, the signal 640 (e.g., setb) minus the floating voltage 642 (e.g., HB) keeps at a value 828 during the time period $T_6$. In yet another example, due to the offset (e.g., $V_{os}$) generated by the offset components 662 and 664, the comparison signal 648 (e.g., setb_out) and the comparison signal 650 (e.g., resetb_out) do not change logic levels. Thus, the increase (e.g., ramping up) of the floating voltage 642 does not cause logic errors to the output of the level-shift circuit 604 according to certain embodiments. For example, the high-side gate drive signal 652 (e.g., GATE_HV) remains at the logic low level during the time period $T_6$ (e.g., as shown by the waveform 814). In another example, the low-side gate drive signal 653 (e.g., GATEL) changes from a logic high level to the logic low level at the beginning of the time period $T_6$ (e.g., at $t_{11}$), and keeps at the logic low level during the time period $T_6$ (e.g., as shown by the waveform 812).

In one embodiment, at the beginning of the time period $T_{p3}$ (e.g., at $t_{12}$), the modulation signal 632 (e.g., PWM_H) changes from the logic low level to the logic high level (e.g., a rising edge as shown by the waveform 816). For example, the pulse signal 634 (e.g., set_pulse) changes from the logic low level to the logic high level (e.g., at $t_{12}$), keeps at the logic high level for the time period $T_{p3}$, and changes back to the logic low level after the time period $T_{p3}$ (e.g., at $t_{14}$ as shown by the waveform 804). In yet another example, during the time period $T_{p3}$, the transistor 606 is turned on by the pulse signal 634 (e.g., set_pulse), and a sink current is generated to flow through the current sink 614 in response. In yet another example, the signal 640 (e.g., setb) minus the floating voltage 642 (e.g., HB) decreases in magnitude from the value 824 to a low value 826 (e.g., at $t_{12}$), keeps at the low value 826 for the time period $T_{p3}$, and increases in magnitude from the value 826 to a value 832 after the time period $T_{p3}$ (e.g., at $t_{14}$ as shown by the waveform 808). In yet another example, during the time period $T_{p3}$, the pulse signal 636 (e.g., reset_pulse) keeps at the logic low level (e.g., as shown by the waveform 806). In yet another example, the transistor 608 remains off, and the signal 646 (e.g., resetb) keeps at the value 828 (e.g., as shown by the waveform 810). In yet another example, the value 832 is approximately equal to the voltage 644 (e.g., vddh) minus the floating voltage 642 (e.g., HB) in magnitude.

For example, during the time period $T_{p3}$, the signal 640 (e.g., setb) is lower than the signal 646 (e.g., resetb) in magnitude. In another example, the difference between the signal 646 and the signal 640 is equal to the product of the sink current and the resistance of the resistor 618 (e.g., $R_Z$), and is larger than the offset ($V_{os}$). In yet another example, the comparison signal 648 (e.g., setb_out) changes from the logic low level to the logic high level. In yet another example, the high-side gate drive signal 652 (e.g., GATE_HV) changes from the logic low level to the logic high level at the end of the time period $T_6$ (e.g., at $t_{13}$ as shown by the waveform 814). In yet another example, the switch 688 is closed (e.g., on), and the floating voltage 642 (e.g., HB) increases in magnitude from the value 820 to the input voltage 694 (e.g., $V_{in}$ at $t_{13}$) as shown by the waveform 802. Thus, if the pulse signal 634 (e.g., set_pulse) arrives during the process of the floating voltage 642 (e.g., HB) increasing in magnitude, the high-side gate drive signal 652 (e.g., GATE_HV) is changed to the logic high level in response to the pulse signal 634 according to certain embodiments.

In another embodiment, at the beginning of the time period $T_7$ (e.g., at $t_{13}$), the floating voltage 642 (e.g., HB) is equal to the input voltage 694 (e.g., $V_{in}$) in magnitude (e.g., as shown by the waveform 802). For example, the signal 646 (e.g., resetb) minus the floating voltage 642 (e.g., HB) increases in magnitude from the value 828 to a value 844 (e.g., as shown by the waveform 810). In another example, during the time period $T_7$, the floating voltage 642 (e.g., HB) keeps equal to the input voltage 694 (e.g., $V_{in}$) in magnitude (e.g., as shown by the waveform 802). In yet another example, the value 844 is approximately equal to the voltage 644 (e.g., vddh) minus the floating voltage 642 (e.g., HB) in magnitude.

In yet another embodiment, at the beginning of the time period $T_{p4}$ (e.g., at $t_{15}$), the modulation signal 632 (e.g., PWM_H) changes from the logic high level to the logic low level (e.g., a falling edge as shown by the waveform 816). For example, the pulse signal 636 (e.g., reset_pulse) changes from the logic low level to the logic high level (e.g., at $t_{15}$), keeps at the logic high level for the time period $T_{p4}$, and changes back to the logic low level after the time period $T_{p4}$ (e.g., at $t_{17}$ as shown by the waveform 806). In yet another example, the transistor 608 is turned on by the pulse signal 636 (e.g., reset_pulse) during the time period $T_{p4}$. In yet another example, the signal 646 (e.g., resetb) minus the floating voltage 642 (e.g., HB) decreases in magnitude from the value 844 to a low value 830 (e.g., at $t_{15}$), keeps at the low value 830 for the time period $T_{p4}$, and increases in magnitude from the value 830 to a value 834 after the time period $T_{p4}$ (e.g., at $t_{17}$ as shown by the waveform 810). In yet another example, the value 834 is approximately equal to the voltage 644 (e.g., vddh) minus the floating voltage 642 (e.g., HB) in magnitude. In yet another example, during the time period $T_{p4}$, the pulse signal 634 (e.g., set_pulse) is at the logic low level (e.g., as shown by the waveform 804), and the transistor 606 remains off. In yet another example, the signal 640 (e.g., setb) minus the floating voltage remains at the value 832 (e.g., as shown by the waveform 808). In yet another example, during the time period $T_{p4}$, the signal 646 (e.g., resetb) is smaller, in magnitude, than the offset signal 670 that is equal to the signal 640 (e.g., setb) minus the offset $V_{os}$. In yet another example, the comparison signal 650 (e.g., resetb_out) changes from the logic low level to the logic high level. In yet another example, the high-side gate drive signal 652 (e.g., GATE_HV) changes from the logic high level to the logic low level at the end of the time period $T_7$ (e.g., at $t_{16}$ as shown by the waveform 814).

According to another embodiment, during the time period $T_8$, the floating voltage 642 (e.g., HB) decreases in magnitude from the input voltage 694 (e.g., $V_{in}$ at $t_{16}$) to a value 838 (e.g., as shown by the waveform 802). For example, at the end of the time period $T_8$, the low-side gate drive signal 653 (e.g., GATEL) changes from the logic low level to the logic high level (e.g., at $t_{18}$ as shown by the waveform 812). In another example, the switch 690 is closed (e.g., on), and the floating voltage 642 (e.g., HB) decreases from the value 838 to a value 836 (e.g., close to 0 V at $t_{18}$) as shown by the waveform 802.

Figure 9:
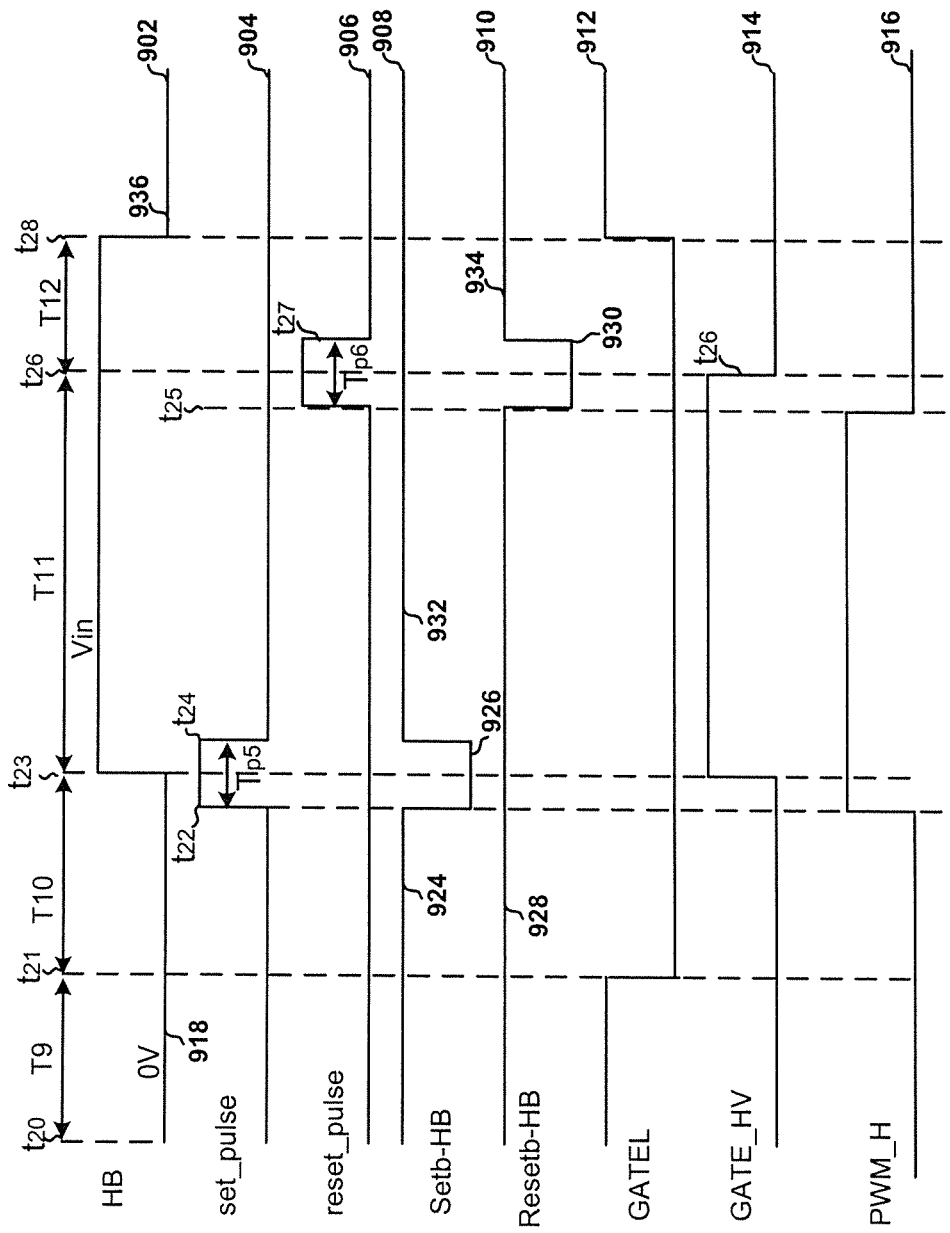
FIG. 9 is a simplified timing diagram for the system shown in FIG. 6 according to yet another embodiment of the present invention.

FIG. 9 is a simplified timing diagram for the system 600 according to yet another embodiment of the present invention. This diagram is merely an example, which should not unduly limit the scope of the claims. One of ordinary skill in the art would recognize many variations, alternatives, and modifications.

The waveform 902 represents the floating voltage 642 (e.g., HB) as a function of time, the waveform 904 represents the pulse signal 634 (e.g., set_pulse) as a function of time, and the waveform 906 represents the pulse signal 636 (e.g., reset_pulse) as a function of time. Additionally, the waveform 908 represents the voltage signal 640 (e.g., setb) minus the floating voltage 642 (e.g., HB) as a function of time, the waveform 910 represents the voltage signal 646 (e.g., resetb) minus the floating voltage 642 (e.g., HB) as a function of time, and the waveform 912 represents the low-side gate-drive signal 653 (e.g., GATEL) as a function of time. Moreover, the waveform 914 represents the high-side gate-drive signal 652 (e.g., GATE_HV) as a function of time, and the waveform 916 represents the high-side modulation signal 632 (e.g., PWM_H) as a function of time.

Six time periods $T_9$, $T_{10}$, $T_{11}$, $T_{12}$, $T_{p5}$ and $T_{p6}$ are shown in FIG. 9. The time period $T_9$ starts at time $t_{20}$ and ends at time $t_{21}$, the time period $T_{10}$ starts at time $t_{21}$ and ends at time $t_{23}$, the time period $T_{11}$ starts at time $t_{23}$ and ends at time $t_{26}$, and the time period $T_{12}$ starts at time $t_{26}$ and ends at time $t_{28}$. Additionally, the time period $T_{p5}$ starts at time $t_{22}$ and ends at time $t_{24}$, and the time period $T_{p6}$ starts at time $t_{25}$ and ends at time $t_{27}$. For example, the time $t_{22}$ is within the time period $T_{10}$, the times $t_{24}$ and $t_{25}$ are within the time period $T_{11}$, and the time $t_{27}$ is within the time period $T_{12}$. In another example, $t_{20} \leq t_{21} \leq t_{22} \leq t_{23} \leq t_{24} \leq t_{25} \leq t_{26} \leq t_{27} \leq t_{28}$. In yet another example, the lengths of the time period $T_{p5}$ and $T_{p6}$ are the same.

According to one embodiment, during the time period $T_9$, the high-side modulation signal 632 (e.g., PWM_H) keeps at a logic low level (e.g., as shown by the waveform 916). For example, the low-side gate drive signal 653 (e.g., GATEL) keeps at a logic high level (e.g., as shown by the waveform 912), and the high-side gate drive signal 652 (e.g., GATE_HV) keeps at the logic low level (e.g., as shown by the waveform 914). In another example, the floating voltage 642 (e.g., HB) keeps at a low value 918 (e.g., 0 V as shown by the waveform 902). In yet another example, the signal 634 (e.g., set_pulse) keeps at the logic low level (e.g., as shown by the waveform 904), and the transistor 606 is not turned on. In yet another example, the voltage signal 640 (e.g., setb) is approximately equal to the voltage 644 (e.g., vddh), and the voltage signal 640 (e.g., setb) minus the floating voltage 642 is equal to a value 924 in magnitude (e.g., as shown by the waveform 908). In yet another example, the signal 636 (e.g., reset_pulse) keeps at the logic low level (e.g., as shown by the waveform 906), and the transistor 608 is not turned on. In yet another example, the voltage signal 646 (e.g., resetb) is approximately equal to the voltage 644 (e.g., vddh), and the voltage signal 646 (e.g., resetb) minus the floating voltage 642 is equal to a value 928 in magnitude (e.g., as shown by the waveform 910). In yet another example, the value 928 is approximately equal to the voltage 644 (e.g., vddh) minus the floating voltage 642 (e.g., HB) in magnitude.

According to another embodiment, during the time period $T_{10}$, the floating voltage 642 (e.g., HB) remains at the low value 918 (e.g., as shown by the waveform 902). For example, the high-side gate drive signal 652 (e.g., GATE_HV) remains at the logic low level (e.g., as shown by the waveform 914). In another example, the low-side gate drive signal 653 (e.g., GATEL) changes from the logic high level to the logic low level at the beginning of the time period $T_{10}$ (e.g., at $t_{21}$), and keeps at the logic low level during the time period $T_{10}$ (e.g., as shown by the waveform 912).

According to yet another embodiment, at the beginning of the time period $T_{p5}$ (e.g., at $t_{22}$), the modulation signal 632 (e.g., PWM_H) changes from the logic low level to the logic high level (e.g., a rising edge as shown by the waveform 916). For example, the pulse signal 634 (e.g., set_pulse) changes from the logic low level to the logic high level (e.g., at $t_{22}$), keeps at the logic high level for the time period $T_{p5}$, and changes back to the logic low level after the time period $T_{p5}$ (e.g., at $t_{24}$ as shown by the waveform 904). In another example, the transistor 606 is turned on by the pulse signal 634 (e.g., set_pulse) during the time period $T_{p5}$. In yet another example, the signal 640 (e.g., setb) minus the floating voltage 642 (e.g., HB) decreases in magnitude from the value 924 to a low value 926 (e.g., at $t_{22}$), keeps at the low value 926 for the time period $T_{p5}$, and increases in magnitude from the value 926 to a value 932 after the time period $T_{p5}$ (e.g., at $t_{24}$ as shown by the waveform 908). In yet another example, during the time period $T_{p5}$, the pulse signal 636 (e.g., reset_pulse) remains at the logic low level (e.g., as shown by the waveform 906), and the transistor 608 remains off. In yet another example, the signal 646 (e.g., resetb) minus the floating voltage 642 (e.g., HB) keeps at the value 928 (e.g., as shown by the waveform 910). In yet another example, during the time period $T_{p5}$, the signal 640 (e.g., setb) is smaller, in magnitude, than the offset signal 668 that is equal to the signal 646 (e.g., resetb) minus the offset $V_{os}$. In yet another example, the comparison signal 648 (e.g., setb_out) changes from the logic low level to the logic high level. In yet another example, the high-side gate drive signal 652 (e.g., GATE_HV) changes from the logic low level to the logic high level at the end of the time period $T_{10}$ (e.g.,
at $t_{23}$ as shown by the waveform 914). In yet another example, the switch 688 is closed (e.g., on), and the floating voltage 642 (e.g., HB) increases from the value 918 to the input voltage 694 (e.g., $V_{in}$ at $t_{23}$) as shown by the waveform 902. In yet another example, the value 932 is approximately equal to the voltage 644 (e.g., vddh) minus the floating voltage 642 (e.g., HB) in magnitude.

According to yet another embodiment, during the time period $T_{11}$, the floating voltage 642 (e.g., HB) remains at the input voltage 694 (e.g., $V_{in}$). For example, the modulation signal 632 (e.g., PWM_H) changes from the logic high level to the logic low level at the beginning of the time period $T_{p6}$, (e.g., a falling edge at $t_{25}$ as shown by the waveform 916). In another example, the pulse signal 636 (e.g., reset_pulse) changes from the logic low level to the logic high level (e.g., at $t_{25}$), keeps at the logic high level for the time period $T_{p6}$, and changes back to the logic low level after the time period $T_{p6}$ (e.g., at $t_{27}$ as shown by the waveform 906). In yet another example, the transistor 608 is turned on by the pulse signal 636 (e.g., reset_pulse). In yet another example, the signal 646 (e.g., resetb) minus the floating voltage 642 (e.g., HB) decreases in magnitude from the value 928 to a low value 930 (e.g., at $t_{25}$), keeps at the low value 930 for the time period $T_{p6}$, and increases in magnitude to a value 934 after the time period $T_{p6}$ (e.g., at $t_{27}$ as shown by the waveform 910). In yet another example, during the time period $T_{p6}$, the pulse signal 634 (e.g., set_pulse) is at the logic low level (e.g., as shown by the waveform 904). In yet another example, the transistor 606 remains off, and the signal 640 (e.g., setb) minus the floating voltage 642 (e.g., HB) keeps at the value 932 (e.g., as shown by the waveform 908). In yet another example, during the time period $T_{p6}$, the signal 646 (e.g., resetb) is smaller, in magnitude, than the offset signal 670 that is equal to the signal 640 (e.g., setb) minus the offset $V_{os}$. In yet another example, the comparison signal 650 (e.g., resetb_out) changes from the logic low level to the logic high level. In yet another example, the high-side gate drive signal 652 (e.g., GATE_HV) changes from the logic high level to the logic low level at the end of the time period $T_{11}$ (e.g., at $t_{26}$ as shown by the waveform 914). In yet another example, the value 934 is approximately equal to the voltage 644 (e.g., vddh) minus the floating voltage 642 (e.g., HB) in magnitude.

According to yet another embodiment, during the time period $T_{12}$, the floating voltage 642 (e.g., HB) keeps at the input voltage 694 (e.g., $V_{in}$) as shown by the waveform 902. For example, at the end of the time period $T_{12}$ (e.g., at $t_{28}$), the low-side gate drive signal 653 (e.g., GATEL) changes from the logic low level to the logic high level (e.g., a rising edge as shown by the waveform 912). In another example, the switch 690 is closed (e.g., on), and the floating voltage 642 (e.g., HB) changes from the input voltage 694 to a value 936 (e.g., close to 0 V at $t_{28}$) as shown by the waveform 902.

FIGS. 7, 8 and 9 are applicable to the system 400 according to some embodiments of the present invention. FIGS. 7, 8 and 9 are applicable to the system 500 according to certain embodiments of the present invention.

Referring back to FIGS. 6, 7 and 8, for example, non-ideal processing errors can cause circuit mismatches, such as mismatches between the resistors (e.g., $R_{up}$, $R_Z$) and/or transistors (e.g., the transistors 606 and 608). In another example, if the circuit mismatches cause the capacitance of the parasitic capacitor 628 to be m % larger than the capacitance of the parasitic capacitor 630, the ratio of the charging current 696 over the charging current 698 is equal to the sum of m % (e.g., 0≤m≤100) and 1 during the process of the floating voltage 642 (e.g., HB) increasing in magnitude. In yet another example, the difference between the current 696 and the current 698 increases with the capacitance of the parasitic capacitors 628 and 630 and the value of m %. In yet another example, if a changing rate (e.g., dV/dt) of the floating voltage 642 (e.g., HB) is large enough, the signal 640 (e.g., setb) is smaller, in magnitude, than the offset signal 668 which is equal to the signal 646 (e.g., resetb) minus the offset (e.g., $V_{os}$). In yet another example, the comparison signal 648 (e.g., setb_out) changes from the logic low level to the logic high level, and the high-side gate drive signal 652 (GATE_HV) changes from the logic low level to the logic high level. A maximum difference between the signal 640 (e.g., setb) and the signal 646 (e.g., resetb) caused by the circuit mismatches can be estimated, and the resistors 618 and 620 (e.g., $R_Z$) and/or the offset (e.g., $V_{os}$) can be properly selected to avoid improper changes of the high-side gate drive signal 652 (GATE_HV) during the process of the floating voltage 642 (e.g., HB) increasing in magnitude, according to certain embodiments.

According to another embodiment, a system for controlling one or more switches includes a first converting circuit, a second converting circuit, and a signal processing component. The first converting circuit is configured to convert a first current and generate a first converted voltage signal based on at least information associated with the first current. The second converting circuit is configured to convert a second current and generate a second converted voltage signal based on at least information associated with the second current. The signal processing component is configured to receive the first converted voltage signal and the second converted voltage signal and generate an output signal based on at least information associated with the first converted voltage signal and the second converted voltage signal. The signal processing component is further configured to generate the output signal at a first logic level if the second converted voltage signal is larger than the first converted voltage signal by at least a first predetermined magnitude. Additionally, the signal processing component is configured to generate the output signal at a second logic level if the first converted voltage signal is larger than the second converted voltage signal by at least a second predetermined magnitude, the second logic level being different from the first logic level. For example, the system is implemented according to FIG. 4, FIG. 5, FIG. 6, FIG. 7, FIG. 8, and/or FIG. 9.

According to yet another embodiment, a system for controlling one or more switches includes a first switch, a first current-sink component, a second switch, a second current-sink component, a first converting circuit, a second converting circuit, a first comparator, and a second comparator. The first switch is configured to receive a first input signal and allow at least a first current to flow through the first switch based on at least information associated with the first input signal. The first current-sink component is coupled to the first switch. The second switch is configured to receive a second input signal and allow at least a second current to flow through the second switch based on at least information associated with the second input signal. The second current-sink component is coupled to the second switch. The first converting circuit is configured to convert the first current and generate a first converted voltage signal based on at least information associated with the first current. The second converting circuit is configured to convert the second current and generate a second converted voltage signal based on at least information associated with the second current. The first comparator is configured to receive the first converted voltage signal and the second converted voltage signal and generate a first comparison signal based on at least information associated with the first converted voltage signal and the second converted voltage signal. The second comparator is configured to receive the first converted voltage signal and the second converted voltage signal and generate a second comparison signal based on at least information associated with the first converted voltage signal and the second converted voltage signal. Additionally, the first comparator is further configured to, if the second converted voltage signal is larger than the first converted voltage signal by at least a first predetermined magnitude, generate the first comparison signal at a first logic level. The second comparator is further configured to, if the first converted voltage signal is larger than the second converted voltage signal by at least a second predetermined magnitude, generate the second comparison signal at the first logic level. For example, the system is implemented according to FIG. 4, FIG. 5, FIG. 6, FIG. 7, FIG. 8, and/or FIG. 9.

In yet another embodiment, a method for controlling one or more switches includes converting a first current to a first converted voltage signal based on at least information associated with the first current, converting a second current to a second converted voltage signal based on at least information associated with the second current, and receiving the first converted voltage signal and the second converted voltage signal. The method further includes processing the first converted voltage signal and the second converted voltage signal and generating an output signal based on at least information associated with the first converted voltage signal and the second converted voltage signal. The process for generating an output signal based on at least information associated with the first converted voltage signal and the second converted voltage signal includes generating the output signal at a first logic level if the second converted voltage signal is larger than the first converted voltage signal by at least a first predetermined magnitude, and generating the output signal at a second logic level if the first converted voltage signal is larger than the second converted voltage signal by at least a second predetermined magnitude, the second logic level being different from the first logic level. For example, the method is implemented according to FIG. 4, FIG. 5, FIG. 6, FIG. 7, FIG. 8, and/or FIG. 9.

In yet another embodiment, a method for controlling one or more switches includes receiving a first input signal at a first switch, processing information associated with the first input signal, and allowing at least a first current to flow through the first switch based on at least information associated with the first input signal. The method further includes receiving a second input signal at a second switch, processing information associated with the second input signal, and allowing at least a second current to flow through the second switch based on at least information associated with the second input signal. Additionally, the method includes converting the first current to a first converted voltage signal based on at least information associated with the first current, converting the second current to a second converted voltage signal based on at least information associated with the second current, receiving the first converted voltage signal and the second converted voltage signal, and processing information associated with the first converted voltage signal and the second converted voltage signal. Furthermore, the method includes generating a first comparison signal based on at least information associated with the first converted voltage signal and the second converted voltage signal, the first comparison signal being at a first logic level if the second converted voltage signal is larger than the first converted voltage signal by at least a first predetermined magnitude. The method further includes generating a second comparison signal based on at least information associated with the first converted voltage signal and the second converted voltage signal, the second comparison signal being at the first logic level if the first converted voltage signal is larger than the second converted voltage signal by at least a second predetermined magnitude. For example, the method is implemented according to FIG. 4, FIG. 5, FIG. 6, FIG. 7, FIG. 8, and/or FIG. 9.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for controlling one or more switches, the system comprising:
    a first converting circuit configured to convert a first current and generate a first converted voltage signal based at least in part on the first current;
    a second converting circuit configured to convert a second current and generate a second converted voltage signal based at least in part on the second current;
    a signal processing component configured to receive the first converted voltage signal and the second converted voltage signal and generate an output signal based on at least information associated with the first converted voltage signal and the second converted voltage signal;
    a first switch configured to receive a first input signal and allow the first current to flow through the first switch based on at least information associated with the first input signal; and
    a second switch configured to receive a second input signal and allow the second current to flow through the second switch based on at least information associated with the second input signal;
    wherein the signal processing component is further configured to:
        if the second converted voltage signal is larger than the first converted voltage signal by at least a first predetermined magnitude, generate the output signal at a first logic level; and
        if the first converted voltage signal is larger than the second converted voltage signal by at least a second predetermined magnitude, generate the output signal at a second logic level, the second logic level being different from the first logic level;
    wherein the signal processing component is further configured to receive a first voltage and a second voltage, the first voltage minus the second voltage in magnitude being equal to a first predetermined value;
    wherein:
        the first switch is further configured to receive the first input signal at the first logic level at a first time, the first time being after the second voltage increases in magnitude to a second predetermined value;
        the second switch is further configured to receive the second input signal at the second logic level at the first time; and
        the signal processing component is further configured to change the output signal from the second logic level to the first logic level at a second time, the second time being no earlier than the first time.

2. The system of claim 1 wherein the first switch is a first N-channel transistor configured to sustain a first maximum drain-source voltage of at least 400 volts.

3. The system of claim 2 wherein the second switch is a second N-channel transistor configured to sustain a second maximum drain-source voltage of at least 400 volts.

4. The system of claim 1 wherein:
    the first converting circuit, the second converting circuit, and the signal processing component are located on a first die;
    the first switch and the second switch are located on a second die; and
    the first die is different from the second die.

5. The system of claim 4 wherein the first die and the second die are connected through bonding wires.

6. The system of claim 5 wherein the first die and the second die are packaged into a same chip.

7. The system of claim 1, and further comprising:
    a first resistor coupled between the first switch and a ground voltage; and
    a second resistor coupled between the second switch and the ground voltage.

8. The system of claim 1 wherein:
    the first switch is further configured to receive the first input signal at the second logic level at a third time, the third time being before the second voltage decreases in magnitude to a third predetermined value;
    the second switch is further configured to receive the second input signal at the first logic level at the third time; and
    the signal processing component is further configured to change the output signal from the first logic level to the second logic level at a fourth time, the fourth time being no earlier than the third time.

9. A system for controlling one or more switches, the system comprising:
    a first converting circuit configured to convert a first current and generate a first converted voltage signal based at least in part on the first current;
    a second converting circuit configured to convert a second current and generate a second converted voltage signal based at least in part on the second current;
    a signal processing component configured to receive the first converted voltage signal and the second converted voltage signal and generate an output signal based on at least information associated with the first converted voltage signal and the second converted voltage signal;
    a first switch configured to receive a first input signal and allow the first current to flow through the first switch based on at least information associated with the first input signal; and
    a second switch configured to receive a second input signal and allow the second current to flow through the second switch based on at least information associated with the second input signal;

wherein the signal processing component is further configured to:
if the second converted voltage signal is larger than the first converted voltage signal by at least a first predetermined magnitude, generate the output signal at a first logic level; and
if the first converted voltage signal is larger than the second converted voltage signal by at least a second predetermined magnitude, generate the output signal at a second logic level, the second logic level being different from the first logic level;

wherein the signal processing component is further configured to receive a first voltage and a second voltage, the first voltage minus the second voltage in magnitude being equal to a first predetermined value;

wherein:
the first switch is further configured to receive the first input signal at the first logic level at a first time, at the first time the second voltage increasing in magnitude to an intermediate value smaller than a second predetermined value;
the second switch is further configured to receive the second input signal at the second logic level at the first time; and
the signal processing component is further configured to change the output signal from the second logic level to the first logic level at a second time, the second time being no earlier than the first time, at the second time the second voltage increasing in magnitude from the intermediate value to the second predetermined value.

10. The system of claim 9 wherein:
the first switch is further configured to receive the first input signal at the second logic level at a third time, the third time being before the second voltage decreases in magnitude to a third predetermined value;
the second switch is further configured to receive the second input signal at the first logic level at the third time; and
the signal processing component is further configured to change the output signal from the first logic level to the second logic level at a fourth time, the fourth time being no earlier than the third time.

11. A system for controlling one or more switches, the system comprising:
a first converting circuit configured to convert a first current and generate a first converted voltage signal based at least in part on the first current;
a second converting circuit configured to convert a second current and generate a second converted voltage signal based at least in part on the second current;
a signal processing component configured to receive the first converted voltage signal and the second converted voltage signal and generate an output signal based on at least information associated with the first converted voltage signal and the second converted voltage signal;
a first switch configured to receive a first input signal and allow the first current to flow through the first switch based on at least information associated with the first input signal; and
a second switch configured to receive a second input signal and allow the second current to flow through the second switch based on at least information associated with the second input signal;

wherein the signal processing component is further configured to:
if the second converted voltage signal is larger than the first converted voltage signal by at least a first predetermined magnitude, generate the output signal at a first logic level; and
if the first converted voltage signal is larger than the second converted voltage signal by at least a second predetermined magnitude, generate the output signal at a second logic level, the second logic level being different from the first logic level;

wherein the signal processing component is further configured to receive a first voltage and a second voltage, the first voltage minus the second voltage in magnitude being equal to a first predetermined value;

wherein:
the first switch is further configured to receive the first input signal at the first logic level at a first time, the first time being before the second voltage increases in magnitude to a second predetermined value;
the second switch is further configured to receive the second input signal at the second logic level at the first time; and
the signal processing component is further configured to change the output signal from the second logic level to the first logic level at a second time, the second time being no earlier than the first time.

12. The system of claim 11 wherein:
the first switch is further configured to receive the first input signal at the second logic level at a third time, the third time being before the second voltage decreases in magnitude to a third predetermined value;
the second switch is further configured to receive the second input signal at the first logic level at the third time; and
the signal processing component is further configured to change the output signal from the first logic level to the second logic level at a fourth time, the fourth time being no earlier than the third time.

13. A system for controlling one or more switches, the system comprising:
a first switch configured to receive a first input signal and allow at least a first current to flow through the first switch based on at least information associated with the first input signal;
a first current-sink component coupled to the first switch;
a second switch configured to receive a second input signal and allow at least a second current to flow through the second switch based on at least information associated with the second input signal;
a second current-sink component coupled to the second switch;
a first converting circuit configured to convert the first current and generate a first converted voltage signal based at least in part on the first current;
a second converting circuit configured to convert the second current and generate a second converted voltage signal based at least in part on the second current;
a first comparator configured to receive the first converted voltage signal and the second converted voltage signal and generate a first comparison signal based on at least information associated with the first converted voltage signal and the second converted voltage signal; and
a second comparator configured to receive the first converted voltage signal and the second converted voltage signal and generate a second comparison signal based on at least information associated with the first converted voltage signal and the second converted voltage signal;

wherein:
the first comparator is further configured to, if the second converted voltage signal is larger than the first converted voltage signal by at least a first predetermined magnitude, generate the first comparison signal at a first logic level; and the second comparator is further configured to, if the first converted voltage signal is larger than the second converted voltage signal by at least a second predetermined magnitude, generate the second comparison signal at the first logic level.

14. The system of claim 13 wherein:
the first comparator is further configured to, if the first converted voltage signal is larger than the second converted voltage signal by at least the second predetermined magnitude, generate the first comparison signal at a second logic level; and
the second comparator is further configured to, if the second converted voltage signal is larger than the first converted voltage signal by at least the first predetermined magnitude, generate the second comparison signal at the second logic level.

15. A method for controlling one or more switches, the method comprising:
receiving a first input signal at a first switch;
processing information associated with the first input signal;
allowing at least a first current to flow through the first switch based on at least information associated with the first input signal;
receiving a second input signal at a second switch;
processing information associated with the second input signal;
allowing at least a second current to flow through the second switch based on at least information associated with the second input signal;
converting the first current to a first converted voltage signal based at least in part on the first current;
converting the second current to a second converted voltage signal based at least in part on the second current;
receiving the first converted voltage signal and the second converted voltage signal;
processing information associated with the first converted voltage signal and the second converted voltage signal;
generating a first comparison signal based on at least information associated with the first converted voltage signal and the second converted voltage signal, the first comparison signal being at a first logic level if the second converted voltage signal is larger than the first converted voltage signal by at least a first predetermined magnitude; and
generating a second comparison signal based on at least information associated with the first converted voltage signal and the second converted voltage signal, the second comparison signal being at the first logic level if the first converted voltage signal is larger than the second converted voltage signal by at least a second predetermined magnitude.

16. A system for controlling one or more switches, the system comprising:
a first converting circuit configured to convert a first current and generate a first voltage signal based at least in part on the first current;
a second converting circuit configured to convert a second current and generate a second voltage signal based at least in part on the second current; and
a signal processing component configured to receive the first voltage signal and the second voltage signal and generate an output signal based on at least information associated with the first voltage signal and the second voltage signal;
wherein the signal processing component is further configured to:
in response to the second voltage signal being larger than the first voltage signal by at least a first predetermined magnitude, generate the output signal at a first logic level; and
in response to the first voltage signal being larger than the second voltage signal by at least a second predetermined magnitude, generate the output signal at a second logic level, the second logic level being different from the first logic level;
wherein the signal processing component is further configured to receive a third voltage and a fourth voltage, a difference between the third voltage and the fourth voltage being equal in magnitude to a predetermined value.

17. A system for controlling one or more switches, the system comprising:
a first switch configured to receive a first input signal and allow at least a first current to flow through the first switch based on at least information associated with the first input signal;
a second switch configured to receive a second input signal and allow at least a second current to flow through the second switch based on at least information associated with the second input signal;
a first converting circuit configured to convert the first current and generate a first voltage signal based at least in part on the first current;
a second converting circuit configured to convert the second current and generate a second voltage signal based at least in part on the second current;
a first comparator configured to receive the first voltage signal and the second voltage signal and generate a first comparison signal based on at least information associated with the first voltage signal and the second voltage signal;
a second comparator configured to receive the first voltage signal and the second voltage signal and generate a second comparison signal based on at least information associated with the first voltage signal and the second voltage signal; and
a flip-flop component configured to receive at least the first comparison signal and the second comparison signal;
wherein:
the first comparator is further configured to, in response to the second voltage signal being larger than the first voltage signal by at least a first predetermined magnitude, generate the first comparison signal at a first logic level; and
the second comparator is further configured to, in response to the first voltage signal being larger than the second voltage signal by at least a second predetermined magnitude, generate the second comparison signal at the first logic level;
wherein:
the first comparator is further configured to, in response to the first voltage signal being larger than the second voltage signal by at least the second predetermined magnitude, generate the first comparison signal at a second logic level; and the second comparator is further configured to, in response to the second voltage signal being larger than the first voltage signal by at least the first predetermined magnitude, generate the second comparison signal at the second logic level;

wherein the flip-flop component is further configured to:
in response to the first comparison signal being at the first logic level and the second comparison signal being at the second logic level, generate an output signal at the first logic level; and
in response to the first comparison signal being at the second logic level and the second comparison signal being at the first logic level, generate the output signal at the second logic level.

18. The system of claim 17, further comprising:
a first current-sink component coupled to the first switch; and
a second current-sink component coupled to the second switch;

wherein:
the first converting circuit, the second converting circuit, the first comparator, the second comparator, and the flip-flop component are located on a first die;
the first switch, the second switch, the first current-sink component and the second current-sink component are located on a second die; and
the first die is different from the second die.

19. The system of claim 18 wherein the first die and the second die are connected through one or more bonding wires.

20. The system of claim 17 wherein:
the first comparator is further configured to receive a third voltage and a fourth voltage, a difference between the third voltage and the fourth voltage being equal in magnitude to a predetermined value; and
the second comparator is further configured to receive the third voltage and the fourth voltage.

* * * * *